United States Patent
Hikata et al.

(10) Patent No.: US 8,668,952 B2
(45) Date of Patent: Mar. 11, 2014

(54) CARBON WIRE AND NANOSTRUCTURE FORMED OF CARBON FILM AND METHOD OF PRODUCING THE SAME

(75) Inventors: Takeshi Hikata, Osaka (JP); Jun-ichi Fujita, Tsukuba (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 621 days.

(21) Appl. No.: 12/920,760

(22) PCT Filed: May 8, 2009

(86) PCT No.: PCT/JP2009/058681
§ 371 (c)(1),
(2), (4) Date: Sep. 2, 2010

(87) PCT Pub. No.: WO2009/139331
PCT Pub. Date: Nov. 19, 2009

(65) Prior Publication Data
US 2011/0003174 A1  Jan. 6, 2011

(30) Foreign Application Priority Data

May 16, 2008  (JP) .................. 2008-129637
Aug. 4, 2008  (JP) .................. 2008-200869
Aug. 27, 2008  (JP) .................. 2008-218314

(51) Int. Cl.
*B05D 5/12* (2006.01)
(52) U.S. Cl.
USPC ................... 427/113; 427/120; 427/122
(58) Field of Classification Search
USPC ............................. 427/113, 120, 122
See application file for complete search history.

(56) References Cited

U.S. PATENT DOCUMENTS

| | | |
|---|---|---|
| 2005/0079120 A1 | 4/2005 | Fujita et al. |
| 2005/0158462 A1 | 7/2005 | Iijima et al. |
| 2007/0120095 A1 | 5/2007 | Gruner |
| 2007/0284557 A1 | 12/2007 | Gruner et al. |
| 2009/0032777 A1 | 2/2009 | Kitano et al. |

FOREIGN PATENT DOCUMENTS

| | | |
|---|---|---|
| CN | 1519196 A | 8/2004 |
| JP | 2000-086219 | 3/2000 |
| JP | 2002-255528 | 9/2002 |
| JP | 2003-238123 | 8/2003 |
| JP | 2003-238126 | 8/2003 |
| JP | 2003-261312 A | 9/2003 |
| JP | 2006-524177 A | 10/2006 |
| JP | 2007-063051 | 3/2007 |

(Continued)

OTHER PUBLICATIONS

K.S. Novoselov et al., "Electric Field Effect in Atomically Thin Carbon Films", Science, vol. 306, pp. 666-669, Oct. 2004.

(Continued)

*Primary Examiner* — Brian K Talbot
(74) *Attorney, Agent, or Firm* — Drinker Biddle & Reath LLP

(57) ABSTRACT

There are provided a carbon wire using CNT or a similar carbon filament having a sufficiently low electrical resistance value, and a wire assembly employing that carbon wire. A carbon wire includes an assembly portion and a graphite layer. The assembly portion is configured of a plurality of carbon filaments implemented as carbon nanotubes in contact with one another. The graphite layer is provided at an outer circumference of the assembly portion.

8 Claims, 9 Drawing Sheets

(56) References Cited

FOREIGN PATENT DOCUMENTS

| JP | 2007-112133 A | | 5/2007 |
|---|---|---|---|
| JP | 2007-112662 | | 5/2007 |
| JP | 2007-115903 A | | 5/2007 |
| JP | 2007-515364 | | 6/2007 |
| JP | 2007-280731 | | 10/2007 |
| JP | 2009-179915 | * | 8/2009 |
| WO | WO 2004/052559 A2 | | 6/2004 |
| WO | WO 2004/069736 A2 | | 8/2004 |
| WO | WO 2004/080578 A1 | | 9/2004 |
| WO | 2005/044723 | | 5/2005 |
| WO | WO 2006/132254 A1 | | 12/2006 |
| WO | 2007/013705 | | 2/2007 |
| WO | WO 2008/051302 A2 | | 5/2008 |

OTHER PUBLICATIONS

K.S. Novoselov et al., "Two-dimensional atomic crystals", Proc. The National Academy of Sciences of the U.S.A., vol. 102, No. 30, pp. 10451-10453, Jul. 2005.

C. Berger et al., "Ultrathin Epitaxial Graphite: 2D Electron Gas Properties and a Route toward Graphene-based Nanoelectronics", J. Phys. Chem. B 108 (2004), pp. 19912-19916, Dec. 2004.

Y. Zhang et al., "Experimental observation of the quantum Hall effect and Berry's phase in graphene", Nature 438, pp. 201-204, Nov. 2005.

J. Fujita et al., "Inducing graphite tube transformation with liquid gallium and flash discharge", Applied Physics Letters, vol. 88 No. 8, pp. 083109.1-083109.3, Feb. 2006.

Jiang et al., "Spinning continuous carbon nanotube yarns", Nature, Oct. 24, 2002, vol. 419, p. 801.

\* cited by examiner

CARBON WIRE AND NANOSTRUCTURE FORMED OF CARBON FILM AND METHOD OF PRODUCING THE SAME

TECHNICAL FIELD

The present invention relates generally to carbon wires, wire assemblies and methods of producing the same, and particularly to carbon wires, wire assemblies and methods of producing the same, that employ a plurality of carbon filaments.

The present invention also relates to electrically conductive film, electrically conductive substrates, and transparent, electrically conductive sheet including graphite film, that are obtained by exposing a carbon nanotube network to Ga vapor, and methods of producing the same.

The present invention also relates to methods of obtaining graphite film by exposing a carbon source to Ga vapor.

BACKGROUND ART

As one example of a carbon filament, a carbon nanotube (CNT) has excellent properties and is accordingly expected to be employed in a variety of industrial applications. For example, a CNT provides substantially as low an electrical resistance value as copper and is thus considered to be used as a material for wire. Furthermore, such CNT is produced in a variety of methods, as proposed for example in Japanese Patent Laying-Open No. 2007-112662 (Patent Document 1).

Japanese Patent Laying-Open No. 2007-112662 proposes a method in which a metal catalyst of gallium (Ga) is introduced in an amorphous carbon wire structure and a direct current is applied thereto to produce a CNT sized, shaped and oriented as desired.

When a carbon atom is chemically bonded by an sp2 hybridized orbital, it forms a lattice-structured film having two dimensionally spread carbocyclic six-membered rings packed in a plane. This carbon atom's two dimensional planar structure is referred to as graphene. As a special example, graphene in a tubular closed structure is a carbon nanotube, and graphene layers stacked in a direction of a normal thereto are graphite.

A carbon nanotube is a tubular material having a diameter equal to or smaller than 1 μm and ideally, a film in a lattice structure of carbocyclic six-membered rings has planes parallel to a tube's axis to form the tube, and a multiple of such tubes may be provided. The carbon nanotube is theoretically expected to exhibit a metallic property or a semiconducting property depending on how the lattice structured films have carbocyclic six-membered rings linked and the tube's thickness, and it is thus expected as a future high-performance material.

For example, Japanese Patent Laying-Open No. 2007-63051 (Patent Document 2), Japanese Patent Laying-Open No. 2002-255528 (Patent Document 3), Japanese Patent Laying-Open No. 2003-238126 (Patent Document 4), and Japanese Patent Laying-Open No. 2000-86219 (Patent Document 5) disclose organizing carbon nanotubes to provide a structure by dispersing carbon nanotubes in a dispersion medium for example ultrasonically to prepare a dispersion liquid of carbon nanotubes which is in turn dropped on a planar substrate and dried thereon to provide a thin film of carbon nanotubes. However, the thin film of carbon nanotubes has the carbon nanotubes interconnected simply by contacting one another, and is thus disadvantageously high in contact resistance.

Graphite has a variety of electrical properties, as observed on graphite film, such as a bandgap, a fractional quantum Hall effect and the like varying with in what size it is cut out, and is thus gaining a large attention in recent years not only for physical phenomena but also in terms of application to devices in the future.

K. S, Novoselov et. al., Science 306 (2004) pp. 666-669. (Non Patent Document 1), K. S, Novoselov et. al., Proc. Natl. Acad. Sci. U.S.A. 102 (2005) pp. 10451-10453. (Non Patent Document 2), C. Berger et. al., J. Phys. Chem. B108 (2004) pp. 19912-19916. (Non Patent Document 3), and Yuanbo Zhang et. al., Nature 438, pp. 201-204 (10 Nov. 2005) (Non Patent Document 4) disclose techniques used to produce a monolayer of graphite film, i.e., graphene.

Typical conventional techniques are provided by K. S, Novoselov et. al., Science 306 (2004) pp. 666-669. (Non Patent Document 1), and K. S, Novoselov et. al., Proc. Natl. Acad. Sci. U.S.A. 102 (2005) pp. 10451-10453. (Non Patent Document 2). More specifically, Scotch tape is stuck on graphite crystal to peel off graphite to leave a single sheet of graphene on a silicon substrate having a surface oxidized and a monolayer of graphene is found and utilized. This technique is a rather primitive technique.

C. Berger et. al., J. Phys. Chem. B108 (2004) pp. 19912-19916. (Non Patent Document 3) discloses that a high temperature process at 1400-1600° C. is performed in an environment of ultrahigh vacuum to decompose a SiC monocrystalline surface and after Si is selectively sublimated a monolayer of graphene is synthesized. Furthermore, it is also disclosed that a diamond microcrystal is first formed and then processed at 1600° C. to obtain graphene from diamond.

Yuanbo Zhang et. al., Nature 438, pp. 201-204 (10 Nov. 2005) (Non Patent Document 4) discloses a method employing chemical vapor deposition to produce graphene. More specifically, camphor vapor is thermally decomposed at 700-850° C. at an Ni crystal face to obtain graphene.

It is difficult, however, to use these methods to handle general, industrial production, and furthermore, the methods cannot provide a large area of graphite film essential to device application.

PRIOR ART DOCUMENTS

Patent Documents

Patent Document 1: Japanese Patent Laying-Open No. 2007-112662
Patent Document 2: Japanese Patent Laying-Open No. 2007-63051
Patent Document 3: Japanese Patent Laying-Open No. 2002-255528
Patent Document 4: Japanese Patent Laying-Open No. 2003-238126
Patent Document 5: Japanese Patent Laying-Open No. 2000-86219

Non Patent Document

Non Patent Document 1: K. S, Novoselov et. al., Science 306 (2004) pp. 666-669.
Non Patent Document 2: K. S, Novoselov et. al., Proc. Natl. Acad. Sci. U.S.A. 102 (2005) pp. 10451-10453.
Non Patent Document 3: C. Berger et. al., J. Phys. Chem. B108 (2004) pp. 19912-19916.
Non Patent Document 4: Yuanbo Zhang et. al., Nature 438, pp. 201-204 (10 Nov. 2005)

SUMMARY OF THE INVENTION

Problems to be Solved by the Invention

The above described conventional CNT production methods focus on controlling CNT as a single CNT in size or the like. When CNT's industrial application is considered, however, it would be necessary to assemble a plurality of such CNTs to produce elongate wire (or carbon wire). As the present inventors have studied, while a single CNT is of significantly low resistance, such a plurality of CNTs (each having a length for example of several tens to several hundreds μm) collected (e.g., stranded) together to provide wire (or carbon wire) exhibit as carbon wire an electrical resistance value higher by approximately 3 digits than copper wire.

The present invention has been made to overcome such disadvantage as described above, and it contemplates a carbon wire employing CNT or a similar carbon filament having a sufficiently low electrical resistance value, and a wire assembly employing the carbon wire.

Furthermore, the present invention also contemplates electrically conductive film having a carbon nanotube network formed of a plurality of low resistance carbon nanotubes linked together by graphite film, an electrically conductive substrate and a transparent, electrically conductive sheet employing the same, and a method for reproducibly producing the same.

Furthermore, the present invention also contemplates a method of producing graphite film that can facilitate synthesizing a large area of graphite film significantly reproducibly.

Means for Solving the Problems

According to the present invention, a carbon wire includes an assembly portion and a graphite layer. The assembly portion is formed of a plurality of carbon filaments in contact with one another. The graphite layer is provided at an outer circumference of the assembly portion.

Thus the carbon wire can have an outer circumferential graphite layer holding an assembly portion to ensure that the assembly portion has its carbon filaments in contact with one another. This allows the assembly portion to have the carbon filaments in contact with one another over an increased area with increased pressure exerted to that area. This can prevent the assembly portion from having the carbon filaments in contact with one another insufficiently and the carbon wire from accordingly having an increased electrical resistance value. Furthermore, the graphite layer can also act as an electrically conductive layer to allow the carbon wire to have a further reduced electrical resistance value.

In the above carbon wire, the carbon filament may be a carbon nanotube. As the carbon nanotube exhibits satisfactory conductivity (or has a low electrical resistance value), the carbon wire can have a further reduced electrical resistance value.

In the above carbon wire, the graphite layer may be a carbon nanotube. The graphite layer can also act as an electrically conductive layer, and can thus more effectively reduce the carbon wire's electrical resistance.

According to the present invention, a wire assembly includes a plurality of the above carbon wires. This allows the wire assembly to be sufficiently low in resistance. Furthermore, the plurality of carbon wires allow the wire assembly to have a large area in cross section and accordingly enable the wire assembly to pass a current of a large value.

According to the present invention, a method of producing a carbon wire includes the steps of: preparing an assembly portion formed of a plurality of carbon filaments in contact with one another; and exposing a surface of the assembly portion to liquid gallium to provide a graphite layer on the surface of the assembly portion.

This allows an assembly portion at a portion of carbon filament that is exposed at a surface to be exposed to liquid gallium to provide a graphite layer through the liquid gallium's catalysis. When this is compared for example with providing a graphite layer directly on a surface of the assembly portion through vapor deposition, the former allows a process to be performed at a temperature lower than the latter to provide the graphite layer to obtain the present carbon wire.

In the above method of producing a carbon wire, the step of exposing may be performed with compressive stress exerted to the assembly portion. This allows a graphite layer to be provided while compressive stress is exerted to the assembly portion, and the resultant carbon wire can have the assembly portion configured of carbon filaments in contact with one another over an increased area with increased pressure exerted to that area. This more reliably ensures that the carbon wire has a reduced electrical resistance value.

In the above method of producing a carbon wire, the step of exposing may be performed with liquid gallium compressed to exert compressive stress to the assembly portion. The liquid gallium compressed (for example by increasing the pressure of an ambient gas that is brought into contact with the liquid gallium, or by enclosing Ga and CNTs in a capsule or a similar container and then compressing them together with the capsule (or container) can facilitate exerting compressive stress to the assembly portion.

In the above method of producing a carbon wire, the step of exposing may be performed with the liquid gallium in contact with ambient gas regulated in pressure to compress the liquid gallium. This can facilitate compressing the liquid gallium. Furthermore, regulating the ambient gas's pressure can facilitate regulating the value of the pressure applied to the liquid gallium.

In the above method of producing a carbon wire, the step of exposing is performed with the liquid gallium having a temperature in a range of 450° C.-750° C. This can more efficiently cause the liquid gallium's catalytic reaction providing the graphite layer from an outer circumference of the assembly portion. Note that the liquid gallium's lower temperature limit is set at 450° C. because if the liquid gallium has a temperature lower than that temperature, the liquid gallium's catalytic reaction is insufficiently provided. Furthermore, the liquid gallium's upper temperature limit is set at 750° C. in order to prevent the assembly portion from having its constituent carbon filaments decomposed.

The above method of producing a carbon wire may include, before the step of exposing, the step of providing an amorphous carbon layer as a surface layer of the assembly portion. Previously providing the amorphous carbon layer that is to serve as the graphite layer allows the graphite layer to be provided while in the assembly portion the carbon filaments' structure can be maintained. This allows an increased degree of freedom in designing the carbon wire in configuration.

The above method of producing a carbon wire may further include, after the step of exposing, the step of removing gallium adhering to a surface of the carbon wire. The step of exposing may results in the carbon wire having a surface with the liquid gallium solidified and thus adhering thereto. The step of removing can remove such solidified gallium from the surface of the carbon wire.

According to the present invention, a method of producing a wire assembly includes the steps of: producing a plurality of carbon wires in the above method of producing carbon wire; and stranding the plurality of carbon wires together to form a wire assembly. Low-resistance carbon wires according to the present invention can thus be used to produce a wire assembly.

Furthermore, the present invention provides electrically conductive film having a carbon nanotube network formed of a plurality of carbon nanotubes linked together by graphite film.

The present invention provides a method of producing the electrically conductive film, including the step of exposing a carbon nanotube network to Ga vapor to provide the graphite film. Bulk Ga and carbon as seen in phase diagram are of a non solid solution type. However, the present inventors have found that in a microscale, Ga and carbon at their surfaces have a bond caused and Ga vapor per se has a catalysis for graphitization reaction.

The present invention provides a method of producing the electrically conductive film, including the steps of: providing amorphous carbon film on a carbon nanotube network; and exposing the carbon nanotube network and the amorphous carbon film obtained in the step of providing, to Ga vapor to provide the graphite film. The present inventors have found that Ga not only in the form of an aggregation of atoms as liquid but also in the form of vapor having atoms liberated converts to a graphite structure at a surface of amorphous carbon, i.e., that it causes a graphitization reaction of the surface of amorphous carbon. In other words, the present invention includes the step of causing Ga vapor to act on amorphous carbon or a similar carbon source to graphitize its surface. Note that in the present invention the graphite film includes both a graphene film in the form of a single layer, and a graphite film formed of graphene films stacked in a plurality of layers.

According to the present invention, the method of producing the electrically conductive film preferably includes, before the step of exposing, the step of mechanically pressure-welding those portions of a plurality of carbon nanotubes forming the carbon nanotube network which are in contact with one another.

The present invention provides an electrically conductive substrate formed with a substrate and electrically conductive film provided on the substrate and having a carbon nanotube network formed of a plurality of carbon nanotubes linked together by graphite film.

The present invention provides a method of producing the electrically conductive substrate, including the steps of: forming a carbon nanotube network on a substrate; and exposing the carbon nanotube network to Ga vapor to provide the graphite film.

The present invention provides a method of producing the electrically conductive substrate, including the steps of: forming a carbon nanotube network on a substrate; providing amorphous carbon film on the carbon nanotube network; and exposing the carbon nanotube network and the amorphous carbon film that is obtained in the step of providing, to Ga vapor to provide the graphite film.

According to the present invention, the method of producing the electrically conductive substrate preferably includes, before the step of exposing, the step of mechanically pressure-welding those portions of a plurality of carbon nanotubes forming the carbon nanotube network which are in contact with one another.

The present invention provides a transparent, electrically conductive sheet formed with a sheet of resin and electrically conductive film provided on the sheet of resin and having a carbon nanotube network formed of a plurality of carbon nanotubes linked together by graphite film.

According to the present invention, preferably in the transparent, electrically conductive sheet, a surface of the sheet of resin that has the electrically conductive film is formed of one of thermosetting resin and ultraviolet (UV) curable resin.

The present invention provides a method of producing the transparent, electrically conductive sheet, including the steps of: forming a carbon nanotube network on a substrate; exposing the carbon nanotube network to Ga vapor to provide the graphite film; and transferring to a sheet of resin an electrically conductive film having the carbon nanotube network formed of a plurality of carbon nanotubes linked together by graphite film in the step of exposing.

The present invention provides a method of producing the transparent, electrically conductive sheet, including the steps of: forming a carbon nanotube network on a substrate; providing amorphous carbon film on the carbon nanotube network; exposing the carbon nanotube network and the amorphous carbon film that is obtained in the step of providing, to Ga vapor to provide the graphite film; and transferring to a sheet of resin an electrically conductive film having the carbon nanotube network formed of a plurality of carbon nanotubes linked together by graphite film in the step of exposing.

According to the present invention, the method of producing a transparent, electrically conductive sheet preferably includes, before the step of exposing, the step of mechanically pressure-welding those portions of the plurality of carbon nanotubes forming the carbon nanotube network which are in contact with one another.

According to the present invention, preferably, the method of producing a transparent, electrically conductive sheet includes the step of transferring to transfer the electrically conductive film to the surface of the sheet of resin that is formed of one of thermosetting resin and ultraviolet curable resin, and the method further includes the step of setting/curing one of the thermosetting resin and the ultraviolet curable resin.

Furthermore, the present invention provides a method of producing graphite film by exposing a surface of a carbon source to Ga vapor to provide graphite film on the surface of the carbon source.

Preferably, the Ga vapor has a temperature equal to or higher than 600° C. Ga vapor having a temperature of 600° C. or higher allows graphitization reaction to proceed satisfactorily.

Preferably, the Ga vapor has a uniform vapor pressure at the surface of the carbon source. This allows a graphite film to be provided with a homogenous property.

Preferably, the Ga vapor is plasmatized.

Furthermore, preferably, the carbon source is located on a substrate and the Ga vapor plasmatized is brought into contact with the substrate having a temperature equal to or higher than 400° C.

Ga vapor plasmatized allows graphite film to be provided while the substrate having a source material of amorphous carbon applied thereon is maintained at as low a temperature as approximately 400° C. Semiconductor device processes require significantly strict temperature restrictions in order to maintain impurity profiles of channels, source/drain layers and the like. For example, approximately 500° C. or higher temperatures cannot be set for processing. Plasmatized gallium allows catalysis to be exhibited at a temperature equal to or lower than 400° C.

Preferably, the carbon source is amorphous carbon.

Preferably, the amorphous carbon is amorphous carbon film provided on a monocrystalline substrate formed of one type selected from the group consisting of SiC, Ni, Fe, Mo, and Pt.

For example, when a graphite film is provided on a silicon oxide film, the graphite film is not necessarily provided as monocrystalline film and instead as polycrystalline film having a domain structure in a broad sense. An underlying substrate that is a SiC, Ni, Fe, Mo, Pt or similar crystalline substrate allows graphite film to be provided as monocrystalline film.

Preferably, the carbon source is a hydrocarbon material. In the present invention the carbon source other than amorphous carbon may be used, such as phenanthrene, pyrene, camphor or similar hydrocarbon materials.

According to the present invention, in the method of producing graphite film, the carbon source can be a three dimensional amorphous carbon structure having a surface exposed to Ga vapor to provide graphite film having a three dimensional surface structure.

For example, Ga vapor used as a catalyst can graphitize not only amorphous carbon in the form of a plane but also a surface of a pillar or a similar, three dimensional, any spatial geometry of amorphous carbon.

Furthermore, the present invention relates to a method of producing graphite film by mixing Ga vapor and a source material gas of a carbon source together and supplying a mixture thereof to provide graphite film on a substrate. This allows the substrate to have relatively thick graphite film thereon.

Preferably, the Ga vapor has a temperature equal to or higher than 600° C. or higher.

Preferably, the Ga vapor is plasmatized.

Preferably, the Ga vapor plasmatized is brought into contact with the substrate having a temperature equal to or higher than 400° C.

Effects of the Invention

The present invention can achieve a low resistance carbon wire and a low resistance wire assembly.

Furthermore, the present invention can achieve a low resistance electrically conductive film having a carbon nanotube network, and an electrically conductive substrate and a transparent, electrically conductive sheet utilizing the same.

The present invention also has a side effect including large light transmission. If fine particles or the like are used to provide a surface of a substrate with electrical conductivity, the particles must be closely packed to cover the surface of the substrate entirely. In contrast, carbon nanotubes can eliminate the necessity of covering the surface of the substrate entirely. The carbon nanotubes that do not entirely cover the surface of the substrate allow the substrate to have the surface with many gaps, which can facilitate transmitting light.

Furthermore, the present method of producing graphite film is applicable to producing a transparent, electrically conductive sheet used for a variety of electronic devices, large-size displays and the like. The present invention, for device applications, can facilitate efficient mass production of monocrystalline graphite film. Furthermore, the present invention, for transparent, electrically conductive sheet, can provide means for obtaining a large area and number of layers of graphite film.

MODES FOR CARRYING OUT THE INVENTION

Hereinafter reference will be made to the drawings to describe the present invention in an embodiment. In the figures, identical or corresponding components are identically denoted and will not be described repeatedly in detail.

<Carbon Wire, Wire Assembly and Their Production Methods>

Figure 1:
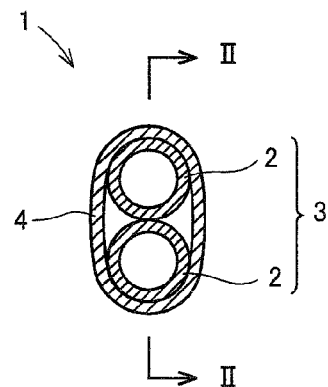
FIG. 1 is a schematic cross section showing an embodiment of a carbon wire in the present invention.
Figure 2:
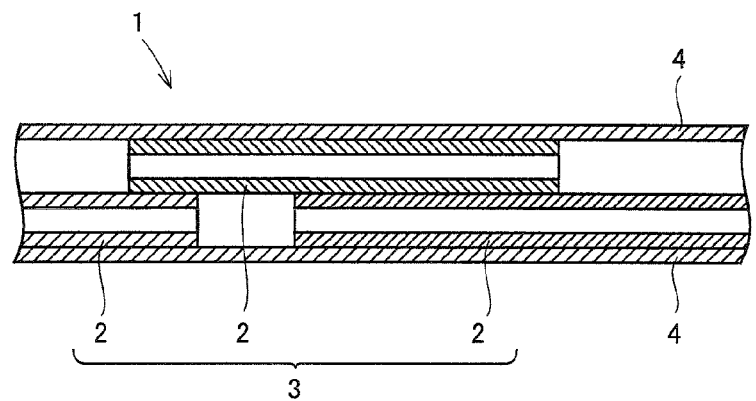
FIG. 2 is a schematic cross section taken along a line II-II shown in FIG. 1.

FIG. 1 is a schematic cross section showing an embodiment of a carbon wire in the present invention. FIG. 2 is a schematic cross section taken along a line II-II shown in FIG. 1. With reference to FIG. 1 and FIG. 2, the present invention provides a carbon wire 1, as will be described hereinafter, Note that FIG. 1 shows carbon wire 1 in cross section as seen in a direction perpendicular to its longitudinal direction and FIG. 2 shows carbon wire 1 in cross section as seen in a direction along its longitudinal direction.

As shown in FIG. 1 and FIG. 2, carbon wire 1 includes an assembly portion 3 and a graphite layer 4. Assembly portion 3 is configured of a plurality of carbon filaments implemented as carbon nanotubes 2 in contact with one another. Graphite layer 4 surrounds assembly portion 3. While FIG. 1 and FIG. 2 show carbon wire 1 configured, as seen in cross section, of two carbon nanotubes 2, carbon wire 1 may have assembly portion 3 configured, as seen in cross section, of two or more, e.g., three or four carbon nanotubes (CNTs) 2. Furthermore, as shown in FIG. 1 and FIG. 2, assembly portion 3 is configured of carbon nanotubes 2 in contact with one another. Furthermore, as shown in FIG. 2, carbon wire 1 as seen in its longitudinal direction also has carbon nanotubes 2 successively in contact with one another to allow assembly portion 3 to have carbon nanotubes 2 forming an electrically conducting path extending in the longitudinal direction of carbon wire 1 and capable of passing an electric current therethrough.

Carbon wire 1 can thus have an outer circumference formed of graphite layer 4 holding assembly portion 3 to ensure that assembly portion 3 has carbon nanotubes 2 in contact with one another. This allows assembly portion 3 to have carbon nanotubes 2 in contact with one another over an increased area with increased pressure exerted to that area. This can prevent assembly portion 3 from having carbon nanotubes 2 in contact with one another insufficiently and hence carbon wire 1 from having an increased electrical resistance value. Furthermore, graphite layer 4 can also act as an electrically conductive layer allowing carbon wire 1 to have a further reduced electrical resistance value.

Furthermore, carbon wire 1 including assembly portion 3 configured of carbon filaments formed of satisfactorily electrically conductive carbon nanotubes 2 ensures that carbon wire 1 has a reduced electrical resistance value.

Preferably, carbon wire 1 has graphite layer 4 formed of a carbon nanotube. In that case, graphite layer 4 can also act as an electrically conductive layer, and carbon wire 1 can further be reduced in electrical resistance.

Furthermore, preferably, graphite layer 4 causes carbon nanotubes 2 that configure assembly portion 3 to press one another. This allows assembly portion 3 to have carbon nanotubes 2 in contact with one another over an increased area with increased pressure exerted to that area, and also allows graphite layer 4 to contact carbon nanotubes 2 of assembly portion 3 over an increased area with increased pressure exerted to that area. As a result, carbon wire 1 of low resistance can be implemented.

Figure 3:
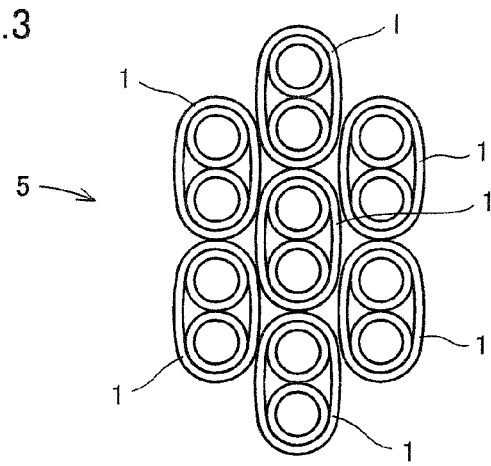
FIG. 3 is a schematic cross section showing an embodiment of a wire assembly in the present invention.

FIG. 3 is a schematic cross section showing an embodiment of a wire assembly in the present invention. With reference to FIG. 3, the present invention provides a wire assembly 5, as will be described hereinafter. Note that FIG. 3 shows wire assembly 5 in cross section as seen in a direction perpendicular to its longitudinal direction.

With reference to FIG. 3, wire assembly 5 includes a plurality of carbon wires 1 as described above (in FIG. 3, it includes seven carbon wires 1). Thus, carbon wire 1 of low resistance according to the present invention can be used to implement wire assembly 5 of sufficiently low resistance. Furthermore, using a plurality of carbon wires 1 allows wire assembly 5 to have a large area in cross section and hence pass a current having a large value. Furthermore, wire assembly 5 may have a plurality of carbon wires 1 twined together, or simply bundled and bound by a clamping member surrounding the plurality of carbon wires 1. The clamping member may for example be an annular clamp formed for example of insulator (e.g., resin).

Note that wire assembly 5 may be configured of carbon wires 1 different in number than as shown in FIG. 3 (for example, the wire assembly may be configured of two or any larger number of carbon wires). Furthermore, while FIG. 3 shows wire assembly 5 configured of carbon wires 1 all identically structured, carbon wire 1 may be different in configuration for some portion in cross section of wire assembly 5. For example, wire assembly 5 as seen in cross section may have a center portion with carbon wire 1 configured of carbon nanotubes 2 (see FIG. 1) bundled in an increased number (as seen in a cross section in a direction perpendicular to that in which carbon wire 1 extends) (e.g., 10 or more carbon nanotubes 2), while wire assembly 5 as seen in cross section may have an outer circumference with carbon wire 1 configured of carbon nanotubes 2 bundled in a number smaller than that of carbon nanotubes 2 bundled that are located in carbon wire 1 at the center portion (e.g., less than ten, more specifically, five or less carbon nanotubes 2 may be bundled together).

Furthermore, wire assembly 5 may be exposed to liquid gallium (a Ga catalyst), as done in the step of providing graphite layer 4 for carbon wire 1, as will be described hereinafter, to provide a graphite layer surrounding wire assembly 5. Furthermore, a plurality of wire assemblies 5 each externally circumferentially surrounded by the graphite layer are prepared and bundled together to prepare a wire having a larger area in cross section. Furthermore, the wire is also exposed to liquid gallium to have a graphite layer surrounding the wire. Furthermore, a plurality of such wires each externally circumferentially surrounded by the graphite layer are bundled together to configure a wire having a larger area in cross section. Thus bundling wires together to provide a wire assembly, exposing the wire assembly to liquid gallium to provide a graphite layer on a surface of the wire assembly, and further bundling a plurality of such wire assemblies each having the graphite layer provided thereon are repeated to produce a wire assembly further reduced in resistance and increased in diameter.

Figure 4:
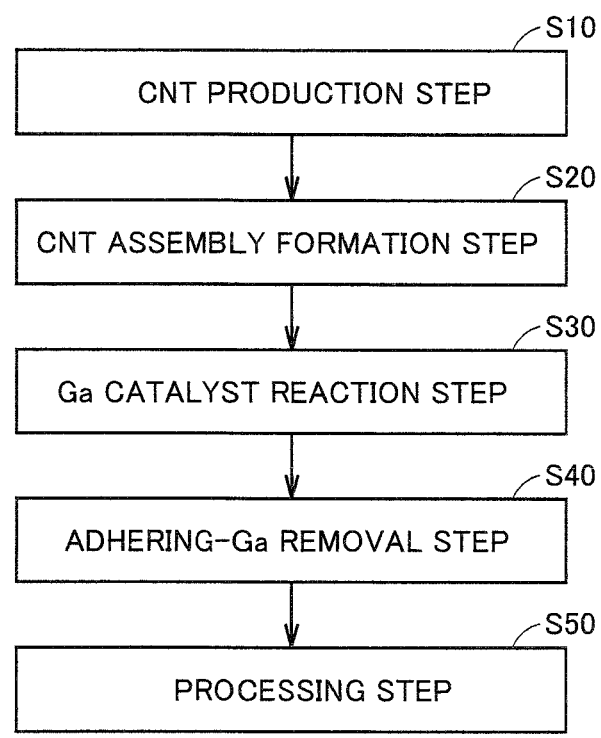
FIG. 4 is a flowchart for illustrating a method of producing the FIG. 3 wire assembly.

FIG. 4 is a flowchart for illustrating a method of producing the FIG. 3 wire assembly. With reference to FIG. 4, the FIG. 3 wire assembly is produced in the method, as will be described hereinafter.

As shown in FIG. 4, wire assembly 5 is produced in a method in which a CNT production step (S10) is first performed. In this CNT (carbon nanotube) production step (S10) a short (e.g., several μm long) carbon nanotube is produced in a conventionally well known method.

For example, a substrate used to produce a CNT is provided on a surface thereof with an underlying film, and on the underlying film a plurality of nanoparticles acting as a catalyst for forming a carbon nanotube are formed such that they are dispersed. The underlying film is configured of material preferably for example of alumina, silica, sodium aluminate, alum, aluminum phosphate or a similar aluminum compound, calcium oxide, calcium carbonate, calcium sulfate or a similar calcium compound, magnesium oxide, magnesium hydroxide, magnesium sulfate or a similar magnesium compound, or calcium phosphate, magnesium phosphate or a similar apatite material. The nanoparticles can be configured of activated metal, such as vanadium (V), chromium (Cr), manganese (Mn), iron (Fe), cobalt (Co), nickel (Ni), copper (Cu), zinc (Zn) or the like.

Furthermore, the nanoparticles have a size for example equal to or smaller than 100 nm, preferably 0.5 nm-10 nm, more preferably 1.0 nm-5 nm. Furthermore, the underlying film can have a thickness for example of 2.0 nm-100 nm.

A gas of a source material for forming a carbon nanotube is supplied to a surface of the substrate having the nanoparticles formed thereon, and the substrate is heated in that condition. As a result, a carbon nanotube is grown on the surfaces of the nanoparticles disposed on the surface of the substrate. The carbon nanotube thus grown is used to form an assembly portion configured of a plurality of carbon nanotubes assembled together, as will be described hereinafter.

Subsequently, as shown in FIG. 4, a CNT assembly formation step (S20) is performed. In this step (S20), a conventionally well known method is used to strand a plurality of carbon nanotubes that are produced in the step (S10) together to form an assembly portion formed of the carbon nanotubes. In this step (S20), a conventionally well known method can be used to form the assembly portion of the carbon nanotubes. For example, a required number of nano-size catalysts can be adjacently placed to grow carbon nanotubes (CNTs) to bond a required number of CNTs together, or furthermore, a plurality of CNTs may have their ends chucked and rotated, and thus formed into a stranded wire.

Subsequently, a Ga catalyst reaction step (S30) is performed. In this step (S30), the assembly portion formed of the carbon nanotubes in the step (S20) has a surface exposed to liquid gallium (Ga). As a result, the assembly portion formed of the carbon nanotubes has a surface layer converted by the liquid gallium's catalytic reaction to a graphite layer surrounding the assembly portion. As a result, as shown in FIG. 1 and FIG. 2, carbon wire 1 having assembly portion 3 surrounded by graphite layer 4 can be obtained. In other words, the steps (S10) to (S30) correspond to a method of producing carbon wire 1.

In doing so, the liquid gallium has a temperature of 450° C.-750° C., more preferably 550° C.-700° C. This can more efficiently cause the liquid gallium's catalytic reaction forming the graphite layer at an outer circumference of assembly portion 3.

Furthermore, the step (S30) of exposing a surface of the assembly portion to liquid gallium to provide a graphite layer is preferably performed while compressive stress is exerted to assembly portion 3. Providing graphite layer 4 while assembly portion 3 experiences compressive stress allows carbon wire 1 to be formed with assembly portion 3 configured of carbon nanotubes 2 in contact with one another over an increased area with increased pressure exerted to that area. This further ensures that carbon wire 1 and wire assembly 5 achieve a reduced electrical resistance value.

Furthermore in the step (S30) preferably the liquid gallium is compressed to exert compressive stress to assembly portion 3. More specifically, an ambient gas that contacts the liquid gallium may be regulated in pressure to compress the liquid gallium. For example, the liquid gallium may be held in a bath held in a holding container (a chamber) and an ambient gas (that contacts the liquid gallium) in that chamber may be regulated in pressure. The liquid gallium thus compressed can facilitate exerting compressive stress to assembly portion 3. Furthermore, the ambient gas regulated in pressure can facilitate regulating a value in pressure applied to the liquid gallium. Note that the ambient gas can for example be argon gas, nitrogen gas or an inert gas less reactable with carbon nanotube and liquid gallium. Furthermore, the ambient gas's pressure can be set for example at gallium (Ga) vapor pressure to 10 Mpa, more preferably $1 \times 10^{-5}$ torr to 1 Mpa.

Subsequently, an adhering-Ga removal step (S40) is performed. More specifically, after the graphite layer is provided, i.e., after the step (S30) is performed, carbon wire 1 has removed the gallium adhering on its surface, i.e., the adhering-Ga removal step (S40) is performed to remove gallium adhering to a surface of carbon wire 1 (i.e., a surface of graphite layer 4) provided. The gallium can be removed in any method. For example, a solution (e.g., diluted hydrochloric acid or diluted nitric acid) that can dissolve gallium may be sprayed to carbon wire 1, or a bath of the solution can be used to immerse carbon wire 1 therein. This can remove from a surface of carbon wire 1 the gallium solidified and thus adhering to the surface of carbon wire 1 in the step (S30). This can reduce in a post-step, or a processing step (S50), a possibility that otherwise solidified gallium causes a defect in forming wire assembly 5.

The steps (S10) to (S40) are performed a plurality of times or the step (S20) is performed to form a plurality of assembly portions formed of carbon nanotubes and the plurality of assembly portions concurrently and in parallel undergo the step (S30) and the step (S40) to obtain a plurality of carbon wires. Thus the steps (S10) to (S40) indicating a method of producing a carbon wire are used to perform a process for producing a plurality of carbon wires.

Subsequently, the processing step (S50) is performed to strand a plurality of carbon wires 1 that are obtained through the step (S10) to the step (S40) together to form wire assembly 5 (see FIG. 3). In this step (S50), any conventionally well known method can be employed to strand the plurality of carbon wires 1 together. For example, a required number of nano-size catalysts can be adjacently placed to grow CNTs to bond a required number of CNTs together, or furthermore, a plurality of CNTs may have their ends chucked and rotated, and thus formed into a stranded wire. Wire assembly 5 formed of carbon wires 1, as shown in FIG. 3, and low in resistance, can thus be obtained.

The method of producing carbon wire 1 or wire assembly 5, as described above, allows a portion of a carbon nanotube (s) of assembly portion 3 that is exposed at a surface to be exposed to liquid gallium to obtain graphite layer 4 through the liquid gallium's catalysis (see FIG. 1 and FIG. 2), as has been described in the step (S30). When this is compared for example with providing graphite layer 4 directly on a surface of assembly portion 3 through vapor deposition, the former allows a process to be performed at a temperature lower than the latter to provide graphite layer 4 to provide the present carbon wire.

Figure 5:
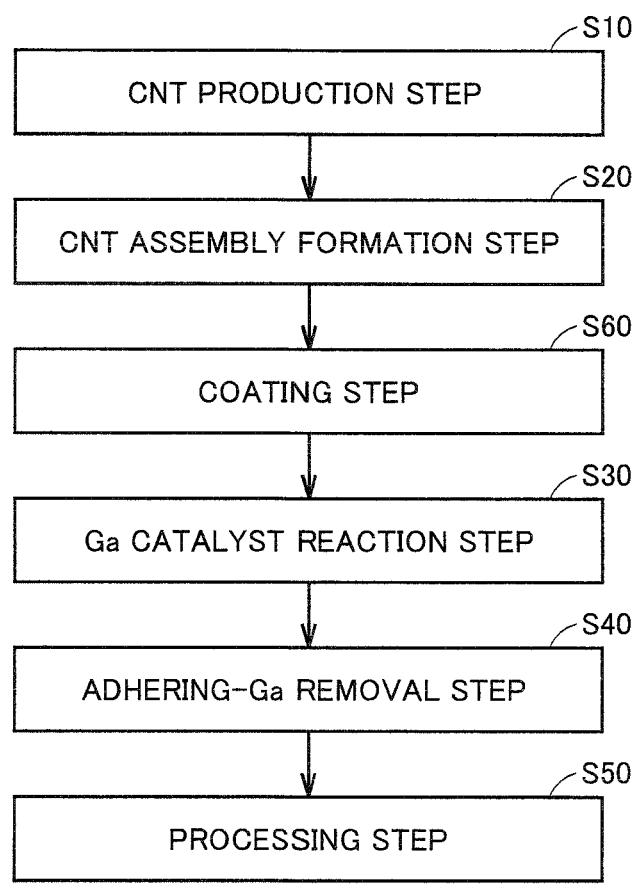
FIG. 5 is a flowchart for illustrating another method of producing a wire assembly according to the present invention.
Figure 6:
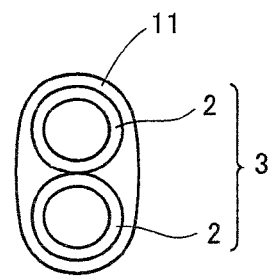
FIG. 6 is a schematic diagram for illustrating a coating step shown in FIG. 5.
Figure 7:
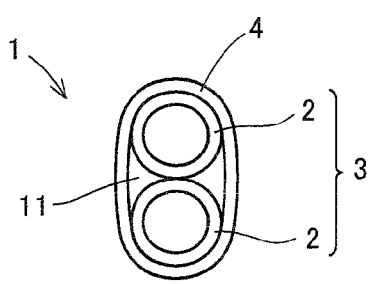
FIG. 7 is a schematic diagram for illustrating a Ga catalyst reaction step shown in FIG. 5.

FIG. 5 is a flowchart for illustrating another method of producing a wire assembly according to the present invention. FIG. 6 is a schematic diagram for illustrating a coating step shown in FIG. 5. FIG. 7 is a schematic diagram for illustrating a Ga catalyst reaction step shown in FIG. 5. With reference to FIG. 5 to FIG. 7, the present invention provides the wire assembly produced in the other method, as will be described hereinafter.

The FIG. 5 wire assembly production method includes steps basically similar to those of the FIG. 4 wire assembly production method, except that the former has the Ga catalyst reaction step (S30) preceded by the step of providing an amorphous carbon layer as a surface layer of an assembly portion, i.e., a coating step (S60).

More specifically, in the FIG. 5 wire assembly production method, the step (S10) and the step (S20) are initially performed, as done in the FIG. 4 wire assembly production method, and thereafter, as shown in FIG. 6, on a surface of assembly portion 3 obtained, an amorphous carbon layer 11, which is to serve as graphite layer 4 (see FIG. 7), is provided. Amorphous carbon layer 11 can be provided in any conventional well known method. For example, phenanthrene ($C_{14}H_{10}$), pyrene, methane acetylene or the like may be thermally decomposed to provide amorphous carbon layer 11, or an electron beam or an ion beam may be used to decompose a hydrocarbon based gas. As a result, the FIG. 6 structure is obtained.

Subsequently, as shown in FIG. 5, the Ga catalyst reaction step (S30) is performed. This step (S30) can be performed in a method basically similar to the step (S30) performed in the FIG. 4 production method. It should be noted, however, that in the FIG. 5 step (S30), amorphous carbon layer 11 has a surface layer converted to graphite layer 4 through the liquid gallium's catalytic reaction. As a result, carbon wire 1 having a structure shown in FIG. 7 can be obtained.

The FIG. 5 production method can thus provide graphite layer 4 from amorphous carbon layer 11 while maintaining a structure of carbon nanotubes 2 in assembly portion 3. The method thus allows an increased degree of freedom in designing carbon wire 1 in configuration.

Subsequently, as done in the FIG. 4 production method, the step (S40) and the step (S50) can be performed to obtain a wire assembly similar in structure to the FIG. 3 wire assembly 5. Note that the FIG. 5 production method produces a wire assembly configured of carbon wire 1 having amorphous carbon layer 11 posed between carbon nanotube 2 configuring assembly portion 3 and graphite layer 4, as can be seen in FIG. 7.

<Electrically Conductive Film, Electrically Conductive Substrate, and Transparent, Electrically Conductive Sheet>

Figure 8:
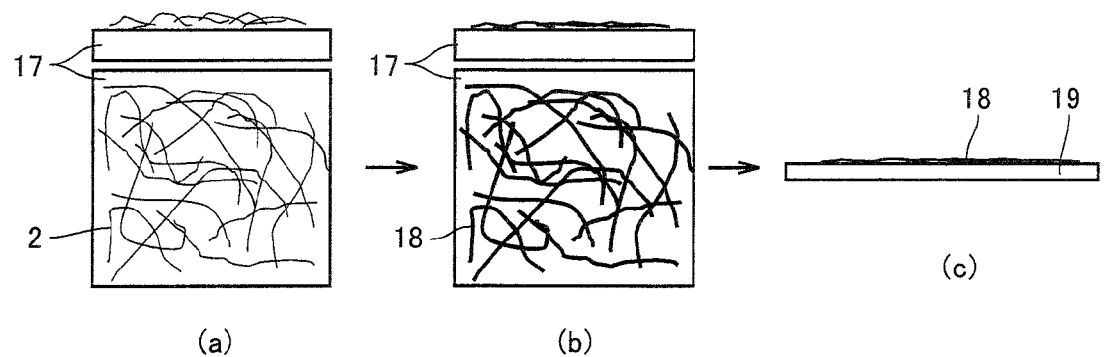
FIG. 8 schematically shows a process for producing electrically conductive film, an electrically conductive substrate, and a transparent, electrically conductive sheet according to the present invention.

FIG. 8 schematically shows a process for producing electrically conductive film, an electrically conductive substrate, and a transparent, electrically conductive sheet according to the present invention. Initially, as shown in FIG. 8 (a), a substrate 17 is exposed to a slurry having carbon nanotubes (hereinafter referred to as CNT(s)) 2 dispersed therein to form a carbon nanotube network (hereinafter referred to as a CNT network) formed of a plurality of CNTs. The carbon nanotube network has a surface exposed to Ga vapor to allow the CNT network to have its constituent CNTs linked together by graphite film to obtain electrically conductive film 18 and an electrically conductive substrate (FIG. 8 (b)). Furthermore, a resin sheet is brought into contact, at a surface thereof having thermosetting resin or ultraviolet (UV) curable resin thereon, with the surface of electrically conductive film 18 that has the CNT network formed thereon, and the resin sheet is then thermally set or UV-cured to transfer the CNT network to the resin sheet to obtain the present transparent, electrically conductive sheet (FIG. 8 (c)).

(Carbon Nanotube)

Carbon nanotube 2, which is a tube having a lattice structure of carbocyclic six-membered rings, may be a tube structured of a single sheet, i.e., a single-walled carbon nanotube (hereinafter also referred to as "SWNT"), or may be a tube structured of multiple layers of tubes having the lattice structure of carbocyclic six-membered rings, i.e., a multiwalled-carbon nanotube (hereinafter also referred to as "MWNT"). In general, an SWNT is more flexible. An MWNT is less flexible than the SWNT, and MWNTs having more multiple layers have a tendency to be more rigid. It is desirable that an SWNT or an MWNT be used depending on the purpose, as occasion demands, with their properties considered.

In what length the carbon nanotube is applicable is not limited to any particular value. In general, however, a carbon nanotube in a range of 10 nm to 1000 μm, preferably 100 nm to 100 μm, is used. The carbon nanotube is not limited in diameter (or thickness) to any particular value. In general, however, a carbon nanotube in a range of 1 nm to 50 nm is used, and for an application requiring more transparency, a carbon nanotube in a range of 3 nm to 10 nm is preferably used.

Note that when carbon nanotubes are applied to substrate 17, it is preferable to previously prepare a slurry having the CNTs dispersed therein. The slurry is prepared as follows: CNTs prepared in an arc process are introduced in acetone and bundled CNTs are ultrasonically debundled and dispersed uniformly in the acetone. Subsequently, before time elapses, the slurry is sprayed to substrate 17 and dried to form a CNT network on the substrate. The acetone may be replaced with alkyl benzene sulfonate or a similar surfactant, a sulfosuccinate diester or a similar solvent having a structure of a hydrophobic moiety-a hydrophilic moiety-a hydrophobic moiety to be used to similarly disperse CNTs therein. In that case, a dispersant or the like will enter between those portions of CNTs at which the CNTs contact one another. Accordingly, preferably, after the slurry is dried on the substrate, water or acetone is used to wash away the dispersant or other matters adhering to the substrate.

(Carbon Nanotube Network)

A carbon nanotube network is formed of a plurality of CNTs randomly intertwined with one another on substrate 17 and thus formed in a network. A conventional CNT network is large in electrical resistance, as it has its CNTs electrically connected only by the physical contact made at those portions of the CNTs at which the CNTs contact one another. The present invention allows a CNT network to be processed with Ga vapor to provide CNTs with a graphite film on their surfaces to link the CNTs together. This can reduce the CNT network's electrical resistance and thus provide electrically conductive film having a low resistance value.

CNTs may be brought into contact with a substrate to form a CNT network in any method. They may be applied in any of generally used methods. Applicable methods include spin-coating, dip-coating, curtain-coating, roll-coating, applying with a brush, spray-coating and the like, for example. In particular, spin-coating is preferable, as it can easily provide a CNT network in a homogeneous thin film.

(Substrate)

Substrate 17 may be any substrate that is normally used for production of electrically conductive film. For example, a substrate formed of glass, mica, quartz or a similar transparent material allows an electrically conductive substrate as a whole to have significantly increased transparency. While it is known to employ carbon vapor deposition, metal vapor deposition or the like to provide a surface of a substrate with electrical conductance, employing a carbon nanotube network to provide a surface of substrate 17 with electrical conductance, as described in the present invention, can eliminate the necessity of completely covering the surface with carbon nanotube. The network has gaps, and thus allows an electrically conductive substrate to have significantly high optical transmittance for a predetermined surface conductivity.

(Electrically Conductive Film)

Electrically conductive film 18 according to the present invention is electrically conductive film having a carbon nanotube network formed of a plurality of carbon nanotubes linked together by graphite film. The electrically conductive film has the CNTs electrically connected via the graphite film, and thus has a low resistance value characteristically.

(Electrically Conductive Substrate)

The electrically conductive substrate according to the present invention is an electrically conductive substrate formed of substrate 17 and electrically conductive film 18 provided on substrate 17 and having a carbon nanotube network formed of a plurality of carbon nanotubes linked together by graphite film. The electrically conductive substrate has CNTs thereon electrically connected via the graphite film, and thus has a low resistance value characteristically.

(Resin Sheet)

Resin sheet 4 may be of any highly transparent resin that is normally used as a substrate. Preferably, polymeric (PET) film having epoxy resin or similar thermosetting resin, or acrylic syrup or similar UV curable resin or similar curable resin applied thereon is used, as it allows the CNT network formed on the electrically conductive film to be transferred efficiently.

The method of producing electrically conductive film, an electrically conductive substrate and a transparent, electrically conductive sheet in accordance with the present invention will more specifically be described hereinafter for the step of providing graphite film on a CNT network.

<Electrically Conductive Film, Electrically Conductive Substrate, Transparent, Electrically Conductive Sheet, and Method of Producing the Same>

Figure 9:
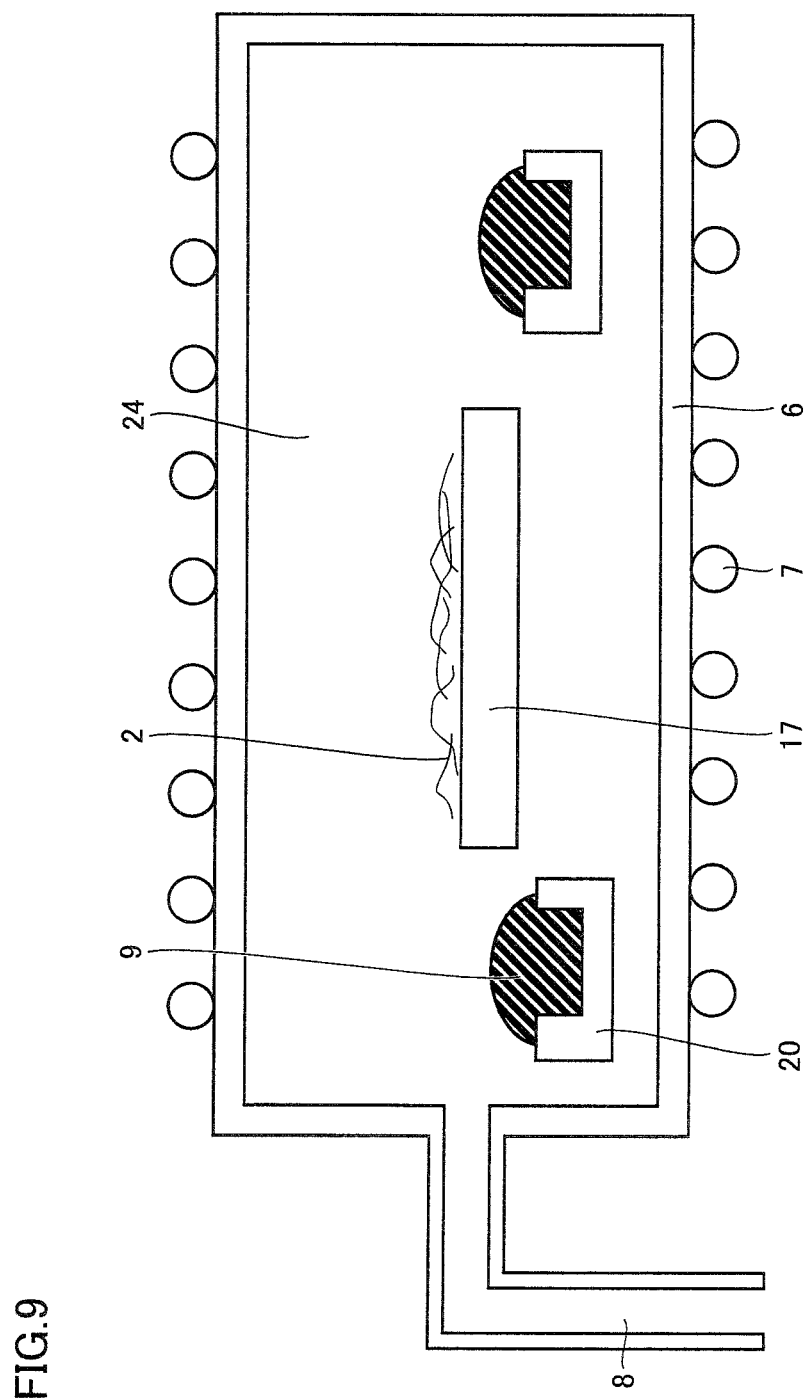
FIG. 9 is a schematic cross section of one example of a graphite film production apparatus used in the present invention.

FIG. 9 is a schematic cross section of one example of a graphite film production apparatus used in the present invention.

(Graphite Film Production Apparatus)

The present invention employs a graphite film production apparatus configured of a quartz reaction tube 6 and an alumina container 20 provided in quartz reaction tube 6 and having liquid Ga 9 introduced therein. Substrate 17 with a plurality of carbon nanotubes 2 formed thereon in a CNT network is to be processed, placed in a vicinity of alumina container 20. External to quartz reaction tube 6, a heater 7 is provided for the reaction tube to regulate the internal temperature of quartz reaction tube 6.

(Preparing Substrate to Be Processed)

Substrate 17 may be a conventionally well known substrate that is normally used for production of electrically conductive film. However, a substrate formed of glass, mica, quartz or a similar transparent material allows an electrically conductive film as a whole to have significantly increased transparency.

The CNT network formed of a plurality of carbon nanotubes 2 may be formed in any conventional well known method. For example, the method includes spin-coating, dip-coating, curtain-coating, roll-coating; applying with a brush, spray-coating and the like, for example. In particular, spin-coating is preferable, as it can easily provide a CNT network in a homogeneous thin film. Subsequently, preferably, the substrate is washed to prevent the CNT network from having a dispersant or similar impurity remaining therein.

To bring the CNTs into close contact with one another, a roller or the like is preferably used to firmly compress the CNT network from above.

Furthermore, preferably, amorphous carbon film is provided on the CNT network to ensure that graphite film is provided. The amorphous carbon film may be provided in any conventional well known method. For example, phenanthrene ($C_{14}H_{10}$), pyrene, methane acetylene or the like may be thermally decomposed to provide the amorphous carbon film, or an electron beam or an ion beam may be used to decompose a hydrocarbon based gas. The amorphous carbon film preferably has a thickness equal to or smaller than 10 nm, as such film can enhance transparency.

(Method of Producing Electrically Conductive Film)

Initially, a substrate to be processed, as aforementioned, is secured in quartz reaction tube 6 horizontally, and a turbo pump is used to vacuum the background to $10^{-6}$ Torr or lower.

Heater 7 heats the reaction tube to evaporate liquid Ga 9 in quartz reaction tube 6 and heats Ga vapor 5 to 600° C. or higher to bring the vapor into contact with a surface of the CNT network formed of a plurality of carbon nanotubes 2. More preferably, Ga vapor 5 is heated to 800° C. or higher to enhance the catalysis of Ga vapor 5.

The above heat treatment is conducted for 10 minutes to 1 hour, and subsequently the reaction tube is slowly cooled to again attain room temperature.

The heat treatment in Ga vapor 5 provides graphite film on a surface of the CNT network formed of carbon nanotubes 2. Thus, on substrate 17, electrically conductive film having a carbon nanotube network formed of a plurality of carbon nanotubes linked together by graphite film is provided, and an electrically conductive substrate is thus obtained.

(Method of Producing Transparent, Electrically Conductive Sheet)

The electrically conductive film produced in the aforementioned process is used to produce a transparent, electrically conductive sheet in a method, as will be described hereinafter.

A sheet of resin is brought into contact with that surface of the aforementioned electrically conductive substrate which has the CNT network formed thereon to transfer the CNT network to the sheet of resin. Preferably, thermosetting resin or UV curable resin is applied to that surface of the sheet of resin which is brought into contact with the CNT network. Subsequently, the sheet of resin is set/cured to secure the CNT network to the sheet of resin to produce a transparent, electrically conductive sheet.

Method of Producing Graphite Film

First Embodiment

Figure 10:
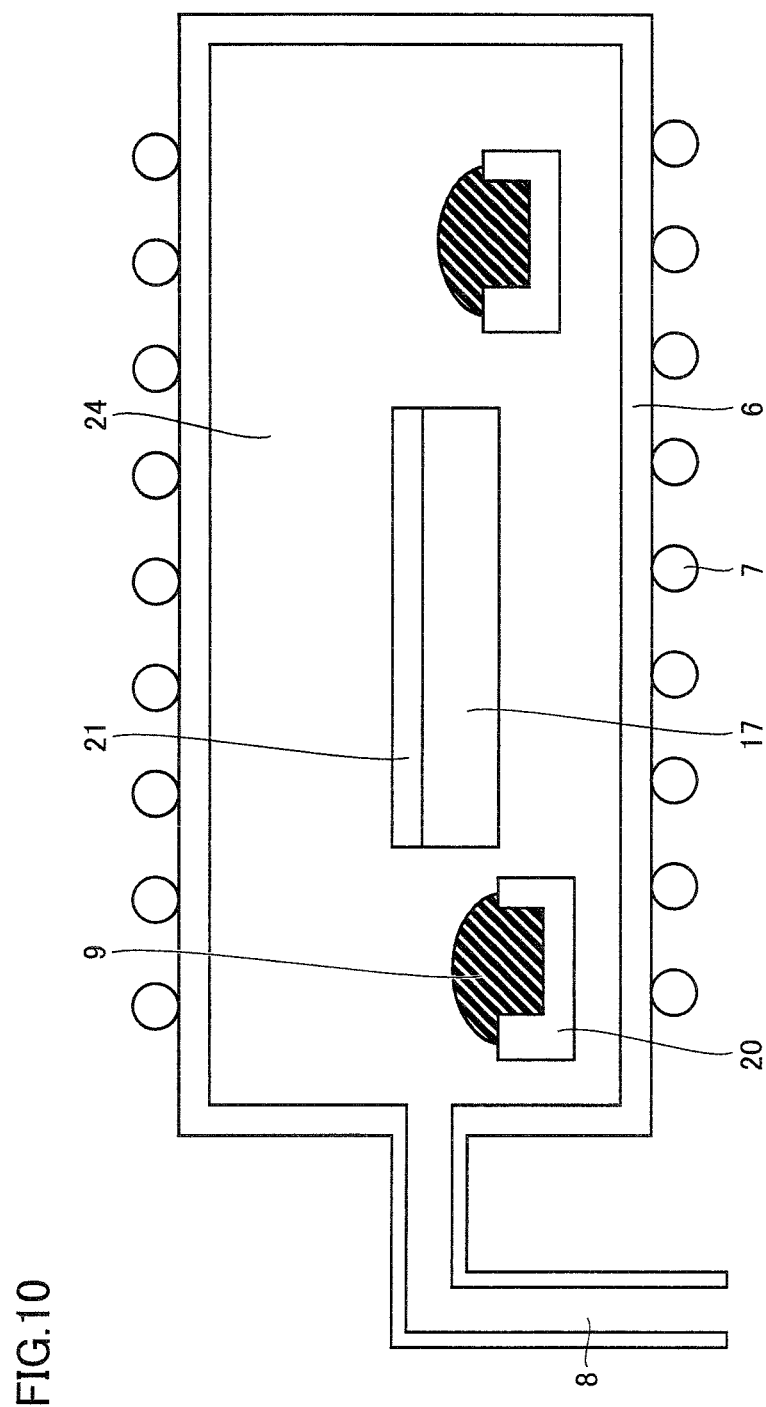
FIG. 10 is a schematic cross section of one example of a graphite film production apparatus used in the present invention.

FIG. 10 is a schematic cross section of one example of a graphite film production apparatus used in the present invention.

(Graphite Film Production Apparatus)

The present invention employs a graphite film production apparatus configured of quartz reaction tube 6 and alumina container 20 provided in quartz reaction tube 6 and having liquid Ga 1 introduced therein. Substrate 17 with amorphous carbon film 21 provided thereon is to be processed, placed in a vicinity of alumina container 20. External to quartz reaction tube 6, heater 7 is provided for the reaction tube to regulate the internal temperature of quartz reaction tube 6.

Substrate 17 may be a conventionally well known substrate that is used as a substrate for production of electrically conductive film. Preferably, an SiC, Ni, Fe, Mo, Pt or similar, monocrystalline substrate is used, as monocrystalline graphite film can be obtained.

Amorphous carbon film 21 may be provided in any conventional well known method. For example, phenanthrene ($C_{14}H_{10}$), pyrene, methane acetylene or the like may be thermally decomposed to provide amorphous carbon film 2, or an electron beam or an ion beam may be used to decompose a hydrocarbon based gas. Amorphous carbon film 21 preferably has a thickness set to match that of graphene film or graphite film targeted.

(Method of Producing Graphite Film)

Initially, a substrate to be processed, as aforementioned, is secured in quartz reaction tube 6 horizontally, and a turbo pump is used to vacuum the background to $10^{-6}$ Torr or lower.

Heater 7 heats the reaction tube to evaporate liquid Ga 9 in quartz reaction tube 6 and heats Ga vapor 5 to 600° C. or higher to bring the vapor into contact with a surface of amorphous carbon film 21.

The above heat treatment is conducted for 10 minutes to 1 hour, and subsequently the reaction tube is slowly cooled to again attain room temperature.

The heat treatment in Ga vapor 5 provides graphite film on a surface of amorphous carbon film 21.

Second Embodiment

Graphite Film Production Apparatus

Figure 11:
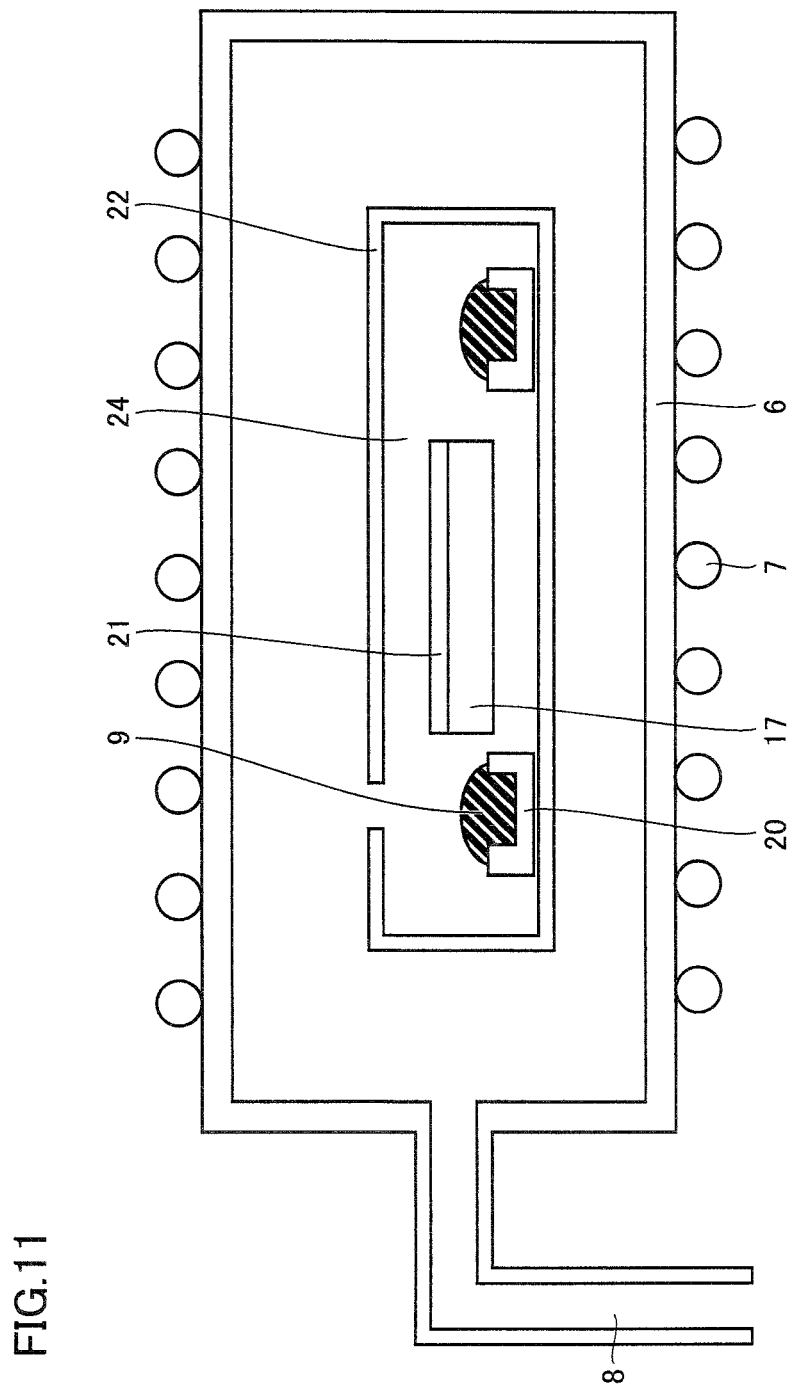
FIG. 11 is a schematic cross section of one example of a graphite film production apparatus showing a configuration of a subordinate Ga reaction chamber.

FIG. 11 is a schematic cross section of one example of a graphite film production apparatus used in the present invention when Ga vapor has uniform vapor pressure at a surface of a carbon source. A second embodiment employs a graphite film production apparatus having quartz reaction tube 6 and a subordinate Ga reaction chamber 22 provided in quartz reaction tube 6 and accommodating alumina container 20 having liquid Ga 9 introduced therein, and substrate 17 having amorphous carbon film 21 thereon, i.e., a substrate to be processed. Subordinate Ga reaction chamber 22 has a wall having a differential evacuation in the form of a small gap.

The first embodiment shows a graphite film production apparatus having quartz reaction tube 6 internally filled with Ga vapor 5 generated from liquid Ga 9. However, while a portion of quartz reaction tube 6 that is close to heater 7 is maintained at a predetermined high temperature, portions of quartz reaction tube 6 that are remoter from heater 7 are lower in temperature, and some of them have room temperature. Thus, in quartz reaction tube 6, Ga vapor 5 varies in temperature at different locations and thus does not have uniform vapor pressure.

As shown in FIG. 11, quartz reaction tube 6 that has subordinate Ga reaction chamber 22 therein allows Ga vapor 5 to be held in subordinate Ga reaction chamber 22 and thus have a fixed vapor pressure. Furthermore, subordinate Ga reaction chamber 22 that accommodates therein alumina container 20 having liquid Ga 9 introduced therein, and substrate 17 having amorphous carbon film 21 thereon, or a substrate to be processed, and that is vacuumed through a small gap serving as a differential evacuation port, can internally have a Ga vapor pressure of a possible maximal value and also provide a uniform Ga vapor pressure in a vicinity of the substrate to be processed. The aforementioned production method can provide graphite film having a surface without inconsistency in color or roughness and thus having a significantly smooth mirror surface.

(Method of Producing Graphite Film)

Initially, a substrate to be processed, as aforementioned, is secured in quartz reaction tube 6 horizontally, and a turbo pump is used to vacuum the background to $10^{-6}$ Torr or lower.

Heater 7 heats the reaction tube to evaporate liquid Ga 9 in quartz reaction tube 6 and heats Ga vapor 5 to 600° C. or higher to bring the vapor into contact with a surface of amorphous carbon film 21. More preferably, Ga vapor 5 is heated to 800° C. or higher to enhance the catalysis of Ga vapor 5.

The heat treatment in Ga vapor 5 provides graphite film on a surface of amorphous carbon film 21.

Third Embodiment

Graphite Film Production Apparatus

Figure 12:
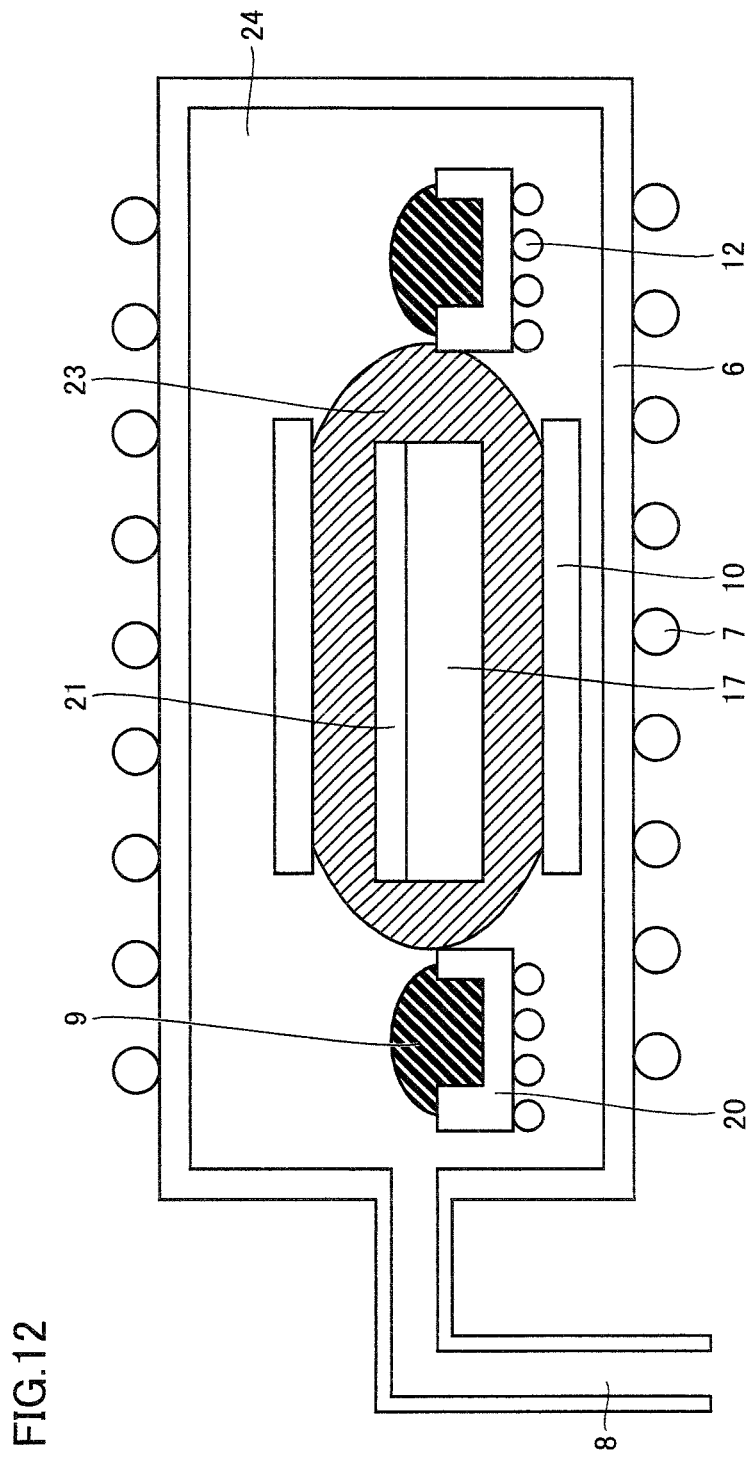
FIG. 12 is a schematic cross section of one example of a graphite film production apparatus employing Ga plasma.

FIG. 12 is a schematic cross section of one example of a graphite film production apparatus employed in the present invention with Ga vapor plasmatized. A third embodiment employs a graphite film production apparatus having quartz reaction tube 6 accommodating alumina container 20 having liquid Ga 9 introduced therein, and a plasma producing electrode 10, with a heater 12 provided at the alumina container for Ga. Substrate 17 with amorphous carbon film 21 thereon, or a substrate to be processed, is positioned in a vicinity of alumina container 20 between paired plasma producing electrodes 10 and exposed to a Ga plasma 23. External to quartz reaction tube 6, heater 7 is provided for the reaction tube to regulate the internal temperature of quartz reaction tube 6.

Using Ga vapor to obtain graphite film is an effective technique to obtain a single or multiple layers of large-area graphite film and is a practical technique directed to electronics device applications. To obtain a transparent, electrically conductive sheet or a similar, electrically conductive film having a large area and a low resistance value, however, a process using Ga vapor must be performed a plurality of times to repeat a reaction until electrically conductive film as predetermined is obtained.

As shown in FIG. 12, Ga vapor can be plasmatized and thus provided with energy to serve as a catalyst to graphitize amorphous carbon. When this is compared with using Ga vapor, the former can provide graphite film larger in thickness. Furthermore, using Ga plasma allows graphitization to be observed on a substrate having as low a temperature as approximately 400° C., and can thus induce graphitization at a lower temperature. For use with a silicon device process, graphite film must be provided directly on a silicon device, and accordingly, it is essential to perform the process at low temperature. In this view, plasmatizing Ga vapor to allow graphite film to be provided in a process performed at low temperature is significantly effective for integration with the silicon device process.

(Method of Producing Graphite Film)

Initially, a substrate to be processed, as aforementioned, is secured in quartz reaction tube 6 horizontally, and a turbo pump is used to vacuum the background to $10^{-6}$ Torr or lower.

Heater 12 for Ga is operated to facilitate evaporating liquid Ga 9, while plasma producing electrodes 10 are used to plasmatize Ga vapor present at a location sandwiched between the electrodes, and heater 7 for the reaction tube is also used to heat the substrate exposed to Ga plasma 11 to 400° C. or higher and Ga plasma 23 is brought into contact with a surface of amorphous carbon film 21. To enhance the catalysis of Ga plasma 23, the substrate to be processed in contact with Ga plasma 23 has a temperature more preferably of 800° C. or higher.

The heat treatment in Ga plasma 23 converts amorphous carbon film 21 at least partially or entirely to graphite film.

Fourth Embodiment

Graphite Film Production Apparatus

Figure 13:
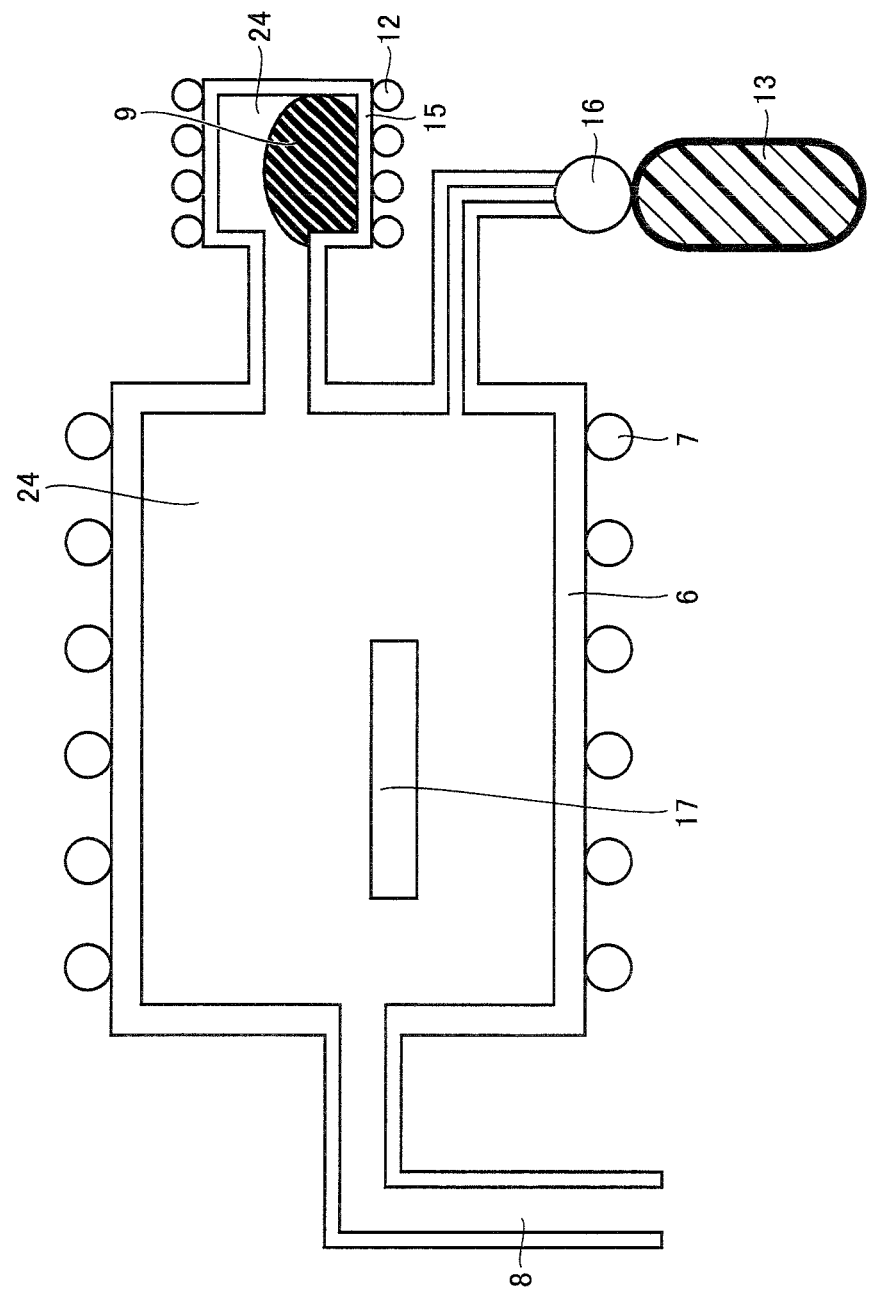
FIG. 13 is a schematic cross section of one example of a graphite film production apparatus with a carbon material supply system and a Ga supply system separated for forming a large area of transparent, electrically conductive sheet.

FIG. 13 is a schematic cross section of one example of a graphite film production apparatus employed in the present invention with a carbon source of a hydrocarbon gas. A fourth embodiment employs a graphite film production apparatus having quartz reaction tube 6 connected to a Ga vapor supply unit 15 and a hydrocarbon gas supply unit 13. Ga vapor supply unit 15 receives liquid Ga 9, which is heated by a heater for Ga and thus evaporated to supply Ga vapor 5 to the interior of quartz reaction tube 6. Hydrocarbon gas supply unit 13 receives hydrocarbon material serving as carbon material, such as camphor, phenanthrene, pyrene or the like, to supply a carbon source as hydrocarbon gas to the interior of quartz reaction tube 6. Quartz reaction tube 6 accommodates substrate 17 therein as a substrate to be processed.

Quartz reaction tube 6 receives the hydrocarbon gas, which reacts with Ga vapor in a vicinity of substrate 17, therewhile the gas is decomposed and thus rapidly forms graphite film on substrate 17.

When Ga is used to provide graphite film on a substrate, the Ga can disadvantageously be introduced into the film. When the substrate has a temperature of 600° C. or higher, the Ga is hardly introduced into the film. When the substrate has a low temperature of 600° C. or lower, and the Ga is accordingly introduced into the graphite film, annealing at approximately 500° C. for a long period of time allows Ga to be separated and thus removed from the film.

(Method of Producing Graphite Film)

Initially, a substrate to be processed, as aforementioned, is secured in quartz reaction tube 6 horizontally, and a turbo pump is used to vacuum the background to $10^{-6}$ Torr or lower.

Heater 12 for Ga is operated to evaporate liquid Ga 9 to supply Ga vapor to the interior of quartz reaction tube 6, while a valve 16 located between hydrocarbon gas supply unit 13 and quartz reaction tube 6 is opened to supply hydrocarbon gas.

Heater 7 for the reaction tube is operated to heat quartz reaction tube 6 to heat Ga vapor 5 therein to 400° C. or higher and bring Ga vapor 5 into contact with a surface of substrate 3. To enhance the catalysis of Ga vapor 5, Ga vapor 5 has a temperature more preferably of 800° C. or higher.

The heat treatment in Ga vapor 5 provides graphite film on substrate 17.

EXAMPLES

Example 1 of the Present Invention

Preparing Sample

An arc process is employed to produce unpurified single-walled carbon nanotubes (CNTs), which are used to form an assembly portion provided as a 0.3 mm-diameter wire formed of stranded CNT filaments. The wire formed of stranded CNT filaments has a length of 10 mm.

The wire formed of stranded CNT filaments is immersed for one hour in liquid gallium (Ga) heated to 600° C. In doing so, an ambient gas of Ar is used, set at a pressure of $1 \times 10^{-5}$ Torr.

Subsequently, the wire formed of stranded CNT filaments is drawn out of the liquid Ga and has Ga that adheres to its surface removed therefrom with diluted hydrochloric acid. The wire formed of stranded CNT filaments is thus provided with a graphite layer on a surface thereof, i.e., a carbon wire is obtained. The graphite layer has a thickness of approximately 5 μm.

Measurement

The carbon wire having the graphite layer is subjected to measurement of electrical resistance by a 4-terminal method.

Result

The carbon wire having the graphite layer has a value in electrical resistance decreased to approximately ⅕ of that of a sample of a comparative example 1 described later.

Example 2 of the Present Invention

Preparing Sample

An arc process is employed to produce unpurified single-walled carbon nanotubes (CNTs), which are used to form an assembly portion provided as a 5 μm-diameter wire formed of stranded CNT filaments. The wire formed of stranded CNT filaments has a length of 10 mm.

Then, phenanthrene ($C_{14}H_{10}$) is thermally decomposed to provide an amorphous carbon layer on a surface of the wire formed of stranded CNT filaments.

Subsequently the wire formed of stranded CNT filaments is immersed for one hour in liquid gallium (Ga) heated to 600° C. In doing so, an ambient gas of Ar is used, set at a pressure of 2 atmospheres.

Subsequently, the wire formed of stranded CNT filaments is drawn out of the liquid Ga and has Ga that adheres to its surface removed therefrom with diluted hydrochloric acid. The wire formed of stranded CNT filaments is thus provided with a graphite layer on a surface thereof, i.e., a carbon wire is obtained. The graphite layer has a thickness of approximately 1 μm.

Measurement

The carbon wire having the graphite layer is subjected to measurement of electrical resistance by a 4-terminal method.

Result

The carbon wire having the graphite layer has a value in electrical resistance decreased to approximately 1/20 of that of the comparative example for example 1 of the present invention.

From this result, the carbon wire is considered to have an interior having a plurality of carbon nanotubes substantially integrated together.

Example 3 of the Present Invention

Preparing Sample 10 nm-diameter, 300 μm long carbon nanotubes (CNTs) are prepared and overlapped by 100 μm to prepare an assembly portion implemented as a wire formed of bonded CNT filaments. The wire formed of bonded CNT filaments has a length of 50 mm and a diameter of 2 μm.

Then, phenanthrene ($C_{14}H_{10}$) is thermally decomposed to provide an amorphous carbon layer on a surface of the wire formed of bonded CNT filaments.

Subsequently the wire formed of bonded CNT filaments is immersed for one hour in liquid gallium (Ga) heated to 500° C. In doing so, an ambient gas of argon (Ar) is used, set at a pressure of 10 atmospheres in order to allow the wire to have its internal carbon nanotubes brought into close contact with one another.

Subsequently, the wire formed of bonded CNT filaments is drawn out of the liquid Ga and has Ga that adheres to its surface removed therefrom with diluted hydrochloric acid. The wire formed of bonded CNT filaments is thus provided with a graphite layer on a surface thereof, i.e., a carbon wire is obtained. The graphite layer has a thickness of approximately 0.2 μm. Furthermore, it has been found that the graphite layer is formed in successive rings wrapping the internal CNTs and has thus become carbon nanotube (CNT).

Measurement

The carbon wire having the graphite layer is subjected to measurement of electrical resistance by a 4-terminal method.

Result

The carbon wire having the graphite layer has a value in electrical resistance smaller than the comparative example by one digit. This is probably because the carbon wire has an interior having carbon nanotubes in close contact with one another and thus integrated together.

Example 4 of the Present Invention

Preparing Sample

Catalytic CVD is employed to prepare a 30 nm-diameter, 500 μm long multiwalled carbon nanotube (CNT), and such CNTs are overlapped by 200 μm to form an assembly portion implemented as a wire formed of bonded CNT filaments. The wire formed of bonded CNT filaments has a length of 10 mm and a diameter of 0.6 μm.

Subsequently the wire formed of bonded CNT filaments is immersed for one hour in liquid gallium (Ga) heated to 550° C. More specifically, the liquid gallium and the wire formed of bonded CNT filaments are enclosed in a capsule of stainless steel. The capsule is surrounded by an ambient gas of argon (Ar). The ambient gas is compressed to exert pressure to the liquid gallium and the wire of bonded CNT filaments together with the capsule. The pressure is set at 100 atmospheres to allow the wire of bonded CNT filaments to have its internal carbon nanotubes brought into close contact with one another.

Subsequently, the wire formed of bonded CNT filaments is drawn out of the liquid Ga and has Ga that adheres to its surface removed therefrom with diluted hydrochloric acid. The wire formed of bonded CNT filaments is thus provided with a graphite layer on a surface thereof, i.e., a carbon wire is obtained. The graphite layer has a thickness of approximately 80 nm. Furthermore, it has been found that the graphite layer is formed in successive rings wrapping the internal CNTs and has thus become carbon nanotube (CNT).

Furthermore, such carbon wires each having the graphite layer are bundled and stranded together to provide a stranded wire to produce a 0.5 μm-diameter stranded wire. Then, as has been done in an above-described step, the stranded wire is immersed in liquid Ga to bond together a plurality of carbon wires configuring the stranded wire (i.e., a graphite layer is formed on a surface of a bundle of a plurality of carbon wires to surround the bundle). Thus the steps of: bundling a plurality of carbon wires together; immersing the wire of the assembly of the bundled carbon wires in liquid Ga to bond the plurality of carbon wires together; and preparing and bundling together a plurality of such wires each of the assembly of the bonded carbon wires are repeated to produce a wire having a larger diameter (more specifically, a 0.1 mm-diameter wire formed of bonded wires).

Measurement

The carbon wire having the graphite layer is subjected to measurement of electrical resistance by a 4-terminal method.

Result

The carbon wire having the graphite layer has a value in electrical resistance smaller than the comparative example by two digits or larger. This is probably because the carbon wire has an interior having carbon nanotubes in close contact with one another and thus integrated together.

Comparative Example 1

Preparing Sample

An arc process is employed to produce unpurified, single-walled carbon nanotubes (CNTs) which are in turn used to form an assembly portion implemented as a 0.3 mm-diameter wire formed of stranded CNT filaments. The wire formed of stranded CNT filaments has a length of 10 mm.

Measurement

The wire formed of stranded CNT filaments is subjected to measurement of electrical resistance by a 4-terminal method.

Result

The comparative example's wire formed of stranded CNT filaments has a value in electrical resistance of $7.8 \times 10^{-3}$ Ω·cm. This value is larger than that of copper by three digits or larger.

Comparative Example 2

Preparing Sample

An arc process is employed to produce unpurified, single-walled carbon nanotubes (CNTs) which are in turn used to form an assembly portion implemented as a 0.3 mm-diameter wire formed of stranded CNT filaments. The wire formed of stranded CNT filaments has a length of 10 mm.

The wire formed of stranded CNT filaments is immersed for one hour in liquid gallium (Ga) heated to 800° C. In doing so, an ambient gas of Ar is used, set at a pressure of $1 \times 10^{-5}$ Torr.

Result

The wire of stranded CNT filaments immersed in the liquid Ga, as described above, has been decomposed in the liquid Ga and thus disappeared. Accordingly, it is preferable that the wire formed of stranded CNT filaments be immersed in liquid gallium heated to a temperature lower than 800° C., more preferably 750° C. or lower.

Examples 5, 6 of the Present Invention, and Comparative Examples 3, 4

A ceramic substrate is prepared and thereon a slurry having CNTs dispersed therein is sprayed and then dried to form a CNT network on the substrate.

For example 5 of the present invention and comparative example 3, an amorphous carbon film of approximately 5 nm on average is provided on the CNT network by laser abrasion.

Subsequently, for examples 5, 6 of the present invention, the FIG. 9 graphite film production apparatus is employed to produce graphite film.

A 1 m long, 25 mm-diameter quartz tube is prepared as quartz reaction tube 6. Quartz reaction tube 6 accommodates an approximately 1 cm-diameter alumina container having liquid Ga 9 introduced therein, and in a vicinity thereof, substrate 17 bearing a plurality of carbon nanotubes 2 forming a CNT network is placed as a substrate to be processed.

Initially, a substrate to be processed, as aforementioned, is secured in quartz reaction tube 6 horizontally, and a turbo pump is used to vacuum the background to $10^{-6}$ Torr or lower.

Heater 7 for the reaction tube is operated to heat Ga vapor 5 to 650° C. to perform a process for one hour and subsequently the reaction tube is slowly cooled again to room temperature. Note that comparative examples 3 and 4 are sample substrates which do not undergo the process with Ga vapor.

The heat treatment with Ga vapor provides graphite film on a surface of the CNT network. For each example, the treatment's temperature and the processed substrate's sheet resistance value are as shown in table 1. Note that the sheet resistance value is measured in a 4-terminal method.

Furthermore, for each example, on the electrically conductive substrate having the CNT network having a surface with the graphite film thereon, a resin sheet having thermosetting resin on a surface that is brought into contact with the CNT network is deposited from above, and then thermally set to transfer and secure the CNT network to the thermosetting resin to obtain a transparent, electrically conductive sheet, which has a sheet resistance value as shown in table 1.

TABLE 1

| | Examples of the Present Invention | | Comparative Examples | |
|---|---|---|---|---|
| | 5 | 6 | 3 | 4 |
| Amorphous carbon film | + | − | + | − |
| Ga vapor process | + | + | − | − |
| Ga process temperature (° C.) | 650 | 650 | − | − |
| Process time | 1 hour | 1 hour | − | − |
| Transparent, electrically conductive sheet's sheet resistance value (kΩ/square) | 10 | 20 | 200 | 500 |

Examples 7, 8 of the Present Invention, and Comparative Examples 5, 6

A glass substrate is prepared and thereon a slurry having CNTs dispersed therein is sprayed and then dried to form a CNT network on the substrate. The substrate is washed with water and acetone to prevent a dispersant or a similar impurity from remaining on the CNT network.

Subsequently, for example 7 of the present invention and comparative example 5, an organic gas (phenanthrene ($C_{14}H_{10}$)) is decomposed to provide amorphous carbon film on the CNT network.

Subsequently, for examples 7, 8 of the present invention, the FIG. 9 graphite film production apparatus is employed to produce graphite film.

A 1 m long, 25 mm-diameter quartz tube is prepared as quartz reaction tube 6. Quartz reaction tube 6 accommodates an approximately 1 cm-diameter alumina container having liquid Ga 9 introduced therein, and in a vicinity thereof, substrate 17 bearing a plurality of carbon nanotubes 2 forming a CNT network is placed as a substrate to be processed.

Initially, a substrate to be processed, as aforementioned, is secured in quartz reaction tube 6 horizontally, and a turbo pump is used to vacuum the background to $10^{-6}$ Torr or lower.

Heater 7 for the reaction tube is operated to heat Ga vapor 5 to 750° C. to perform a process for 10 minutes and subsequently the reaction tube is slowly cooled again to room temperature. Note that comparative examples 5 and 6 are sample substrates which do not undergo the process with Ga vapor.

The heat treatment with Ga vapor provides graphite film on a surface of the CNT network. For each example, the treatment's temperature and the processed substrate's sheet resistance value are as shown in table 2. Note that the sheet resistance value is measured in a 4-terminal method.

Furthermore, for each example, on the electrically conductive substrate having the CNT network having a surface with the graphite film thereon, a resin sheet having thermosetting resin on a surface that is brought into contact with the CNT network is deposited from above, and then thermally set to transfer and secure the CNT network to the thermosetting resin to obtain a transparent, electrically conductive sheet, which has a sheet resistance value as shown in table 2.

TABLE 2

|  | Examples of the Present Invention | | Comparative Examples | |
| --- | --- | --- | --- | --- |
|  | 7 | 8 | 5 | 6 |
| Amorphous carbon film | + | − | + | − |
| Ga vapor process | + | + | − | − |
| Ga process temperature (° C.) | 750 | 750 | − | − |
| Process time | 10 min. | 10 min. | − | − |
| Transparent, electrically conductive sheet's sheet resistance value (kΩ/square) | 5 | 10 | 300 | 800 |

Examples 9-11 of the Present Invention, and Comparative Examples 7, 8

The FIG. 10 graphite film production apparatus is employed to produce graphite film.

A 1 m long, 25 mm-diameter quartz tube is prepared as quartz reaction tube 6. Quartz reaction tube 6 accommodates an approximately 1 cm-diameter alumina container having liquid Ga 9 introduced therein, and in a vicinity thereof, substrate 17 bearing amorphous carbon film 21 is placed as a substrate to be processed. The substrate to be processed is a silicon substrate having a surface with an approximately 500 nm thick thermal oxide film thereon and an amorphous carbon film provided at that surface by laser abrasion.

Examples 9-11 of the Present Invention, and Comparative Example 7

Initially, a substrate to be processed, as aforementioned, is secured in quartz reaction tube 6 horizontally, and a turbo pump is used to vacuum the background to $10^{-6}$ Torr or lower.

Heater 7 for the reaction tube is operated to heat Ga vapor 5 to a temperature indicated in table 3 to perform a process for one hour, and the reaction tube is slowly cooled again to room temperature.

Examples 9-11 of the present invention provide approximately 3-5 layers of graphite film on a surface of amorphous carbon film through the heat treatment in Ga vapor. Each sample substrate has a significantly smooth mirror surface without variation in color, or roughness.

Subsequently, the aforementioned amorphous carbon deposition and Ga process are repeated until substrate 3 has amorphous carbon film and graphite film thereon together forming a film having a thickness of approximately 50 nm. Each resultant sample substrate has a sheet resistance value, as shown in table 3.

Comparative Example 8

In a comparative example 8, a substrate to be processed which is similar to those of the examples of the present invention is thermally treated in quartz reaction tube 6 at 600° C. without liquid Ga 1 introduced therein. In other words, the substrate simply undergoes the heat treatment without subjecting amorphous carbon film to the Ga process. The other steps are performed similarly as done in the above examples of the present invention. The resultant sample substrate has a sheet resistance value as shown in table 3.

TABLE 3

|  | Examples of the Present Invention | | | Comparative Examples | |
| --- | --- | --- | --- | --- | --- |
|  | 9 | 10 | 11 | 7 | 8 |
| Process temperature (° C.) | 600 | 700 | 800 | 200 | 600 |
| Sheet resistance value (kΩ/square) | 100 | 20 | 6 | ∞ | 1500 |

Examples 12-14 of the Present Invention, and Comparative Examples 9, 10

The FIG. 11 graphite film production apparatus is employed to produce graphite film.

A 1 m long, 25 mm-diameter quartz tube is prepared as quartz reaction tube 6. Quartz reaction tube 6 accommodates subordinate Ga reaction chamber 22 accommodating an approximately 1 cm-diameter alumina container having liquid Ga 9 introduced therein, and in a vicinity thereof, substrate 17 bearing amorphous carbon film 21 is placed as a substrate to be processed. The substrate to be processed is a silicon substrate having a surface with an approximately 500 nm thick thermal oxide film thereon and an amorphous carbon film provided at that surface by laser abrasion.

Examples 12-14 of the present invention, and Comparative Example 9

Initially, a substrate to be processed, as aforementioned, is secured in subordinate Ga reaction chamber 22 horizontally, and a turbo pump is used to vacuum the background to $10^{-6}$ Torr or lower.

Heater 7 for the reaction tube is operated to heat Ga vapor 5 in subordinate Ga reaction chamber 22 to a temperature indicated in table 4 to perform a process for 10 minutes, and the reaction tube is slowly cooled again to room temperature.

Examples 12-14 of the present invention provide approximately 3-5 layers of graphite film on a surface of amorphous carbon film through the heat treatment in Ga vapor. Each sample substrate has a significantly smooth mirror surface without variation in color, or roughness.

Subsequently, the aforementioned amorphous carbon deposition and Ga process are repeated until substrate 17 has amorphous carbon film and graphite film thereon together forming a film having a thickness of approximately 100 nm. For each example, the process's temperature and the resultant sample substrate's sheet resistance value are as shown in table 4.

Comparative Example 10

In a comparative example 10, a substrate to be processed which is similar to those of the examples of the present invention is thermally treated in quartz reaction tube 6 at 600° C. for 10 minutes without liquid Ga 1 introduced therein. In other words, the substrate simply undergoes the heat treatment without subjecting amorphous carbon film to the Ga process. The other steps are performed similarly as done in the above examples of the present invention. The resultant sample substrate has a sheet resistance value as shown in table 4.

TABLE 4

|  | Examples of the Present Invention | | | Comparative Examples | |
| --- | --- | --- | --- | --- | --- |
|  | 12 | 13 | 14 | 9 | 10 |
| Process temperature (° C.) | 600 | 700 | 800 | 200 | 600 |
| Sheet resistance value (kΩ/square) | 120 | 30 | 5 | ∞ | 2000 |

Examples 15-17 of the Present Invention, and Comparative Examples 11, 12

The FIG. 12 graphite film production apparatus is employed to produce graphite film.

A 1 m long, 25 mm-diameter quartz tube is prepared as quartz reaction tube 6. Quartz reaction tube 6 accommodates a pair of plasma producing electrodes 10 therein, and in a vicinity thereof, alumina container 20 having a diameter of approximately 1 cm and having liquid Ga 1 introduced therein is placed. At the alumina container, heater 12 is placed for Ga. Substrate 17 bearing amorphous carbon film 21 thereon is placed between plasma producing electrodes 10 as a substrate to be processed. The substrate to be processed is a silicon substrate having a surface with an approximately 500 nm thick thermal oxide film thereon and an amorphous carbon film provided at that surface by laser abrasion.

Examples 15-17 of the Present Invention, and Comparative Example 11

Initially, a substrate to be processed, as aforementioned, is secured between plasma producing electrodes 10 horizontally, and a turbo pump is used to vacuum the background to $10^{-6}$ Torr or lower.

Heater 12 for Ga is operated to facilitate evaporating liquid Ga 9, while plasma producing electrodes 10 are used to plasmatize Ga vapor present at a location sandwiched between the electrodes, and heater 7 for the reaction tube is also used to heat the substrate in contact with Ga plasma 23 to a temperature indicated in table 5 and a 10-minute process is also performed, and the reaction tube is slowly cooled again to room temperature.

Examples 15-17 of the present invention each provide approximately 3-5 layers of graphite film on a surface of the substrate through the heat treatment in Ga plasma. Each sample substrate has a significantly smooth mirror surface without variation in color, or roughness.

Subsequently, the aforementioned amorphous carbon deposition and Ga process are repeated until substrate 17 has amorphous carbon film and graphite film thereon together forming a film having a thickness of approximately 100 nm. For each example, the process's temperature and the resultant sample substrate's sheet resistance value are as shown in table 5.

Comparative Example 12

In a comparative example 12, a substrate to be processed which is similar to those of the examples of the present invention is thermally treated in quartz reaction tube 6 at 600° C. for 10 minutes without liquid Ga 9 introduced therein. In other words, the substrate simply undergoes the heat treatment without subjecting amorphous carbon film to the Ga process. The other steps are performed similarly as done in the above examples of the present invention. The resultant sample substrate has a sheet resistance value as shown in table 5.

TABLE 5

|  | Examples of the Present Invention | | | Comparative Examples | |
| --- | --- | --- | --- | --- | --- |
|  | 15 | 16 | 17 | 11 | 12 |
| Process temperature (° C.) | 400 | 600 | 800 | 200 | 600 |
| Sheet resistance value (kΩ/square) | 90 | 60 | 3 | ∞ | 2200 |

Examples 18-20 of the Present Invention, and Comparative Examples 13, 14

The FIG. 13 graphite film production apparatus is employed to produce graphite film.

A 1 m long, 25 mm-diameter quartz tube is prepared as quartz reaction tube 6. Quartz reaction tube 6 is connected to Ga vapor supply unit 15 and hydrocarbon gas supply unit 13. Ga vapor supply unit 15 has liquid Ga introduced therein. Hydrocarbon gas supply unit 13 has phenanthrene introduced therein as a carbon source material. As a substrate to be processed, substrate 17 is placed in quartz reaction tube 6.

Examples 18-20 of the Present Invention, and Comparative Example 13

Initially, a substrate to be processed, as aforementioned, is secured in quartz reaction tube 6 horizontally, and a turbo pump is used to vacuum the background to $10^{-6}$ Torr or lower.

Heater 12 for Ga is used to evaporate liquid Ga 9 to supply Ga vapor to the interior of quartz reaction tube 6, while valve 16 located between hydrocarbon gas supply unit 13 having phenanthrene introduced therein and quartz reaction tube 6 is opened to supply hydrocarbon gas.

Heater 7 for the reaction tube is operated to raise the temperature in quartz reaction tube 6 to that indicated in table 6 and a 30-minute process is performed, and the reaction tube is slowly cooled again to room temperature.

Examples 18-20 of the present invention each provide graphite film on a surface of the substrate through the heat treatment in Ga vapor to have a thickness of 200 nm. Each sample substrate has a significantly smooth mirror surface without variation in color, or roughness. For each example, the process's temperature and the resultant sample substrate's sheet resistance value are as shown in table 6.

Comparative Example 14

In a comparative example 14, a substrate to be processed which is similar to those of the examples of the present invention is thermally treated in quartz reaction tube 6 at 600° C. for 30 minutes without liquid Ga 9 introduced therein. In other words, the substrate simply undergoes the heat treatment without subjecting amorphous carbon film to the Ga process. The other steps are performed similarly as done in the above examples of the present invention. The resultant sample substrate has a sheet resistance value as shown in table 6.

TABLE 6

|  | Examples of the Present Invention | | | Comparative Examples | |
| --- | --- | --- | --- | --- | --- |
|  | 18 | 19 | 20 | 13 | 14 |
| Process temperature (° C.) | 400 | 600 | 800 | 200 | 600 |
| Sheet resistance value (kΩ/square) | 160 | 40 | 2 | ∞ | 1500 |

INDUSTRIAL APPLICABILITY

The present invention is advantageously applicable particularly to carbon wires configured of a plurality of short carbon nanotubes combined together, and wire assemblies employing such carbon wires.

Furthermore, the present invention allows mass production of a significantly thin stack of graphite layers or a monolayer of graphite film in large areas. The monolayer of graphite film having a large area can be used to allow application to an LSI or similar, large scale graphene integrated circuit. Furthermore, increasing thickness allows a transparent, electrically conductive sheet having a large area to be formed, and it is expected to be applied to a large size liquid crystal display.

DESCRIPTION OF THE REFERENCE SIGNS

1: carbon wire, 2: carbon nanotube, 3: assembly portion, 4: graphite layer, 5: wire assembly, 6: quartz reaction tube, 7: heater for reaction tube, 8: evacuation system, 9: liquid Ga, 10: plasma producing electrode, 11: amorphous carbon layer, 12: heater for Ga, 13: hydrocarbon gas supply unit, 14: reactor, 15: Ga vapor supply unit, 16: valve, 17: substrate, 18: carbon nanotube network, 19: sheet of resin, 20: alumina container, 21: amorphous carbon film, 22: subordinate Ga reaction chamber, 23: Ga plasma, 24: Ga vapor.

The invention claimed is:

1. A method of producing carbon wire, comprising the steps of:
   preparing an assembly portion formed of a plurality of carbon filaments in contact with one another; and
   forming a graphite layer at an outer circumference of said assembly portion by exposing surfaces of said carbon filaments to liquid gallium as a catalyst for graphitization reaction, wherein in the step of forming, said liquid gallium has a temperature ranging from 200° C. to 800° C.

2. The method of producing carbon wire according to claim 1, wherein in the step of exposing, compressive stress is exerted to said assembly portion.

3. The method of producing carbon wire according to claim 2, wherein in the step of exposing, said liquid gallium is compressed to exert the compressive stress to said assembly portion.

4. The method of producing carbon wire according to claim 3, wherein in the step of exposing, said liquid gallium is exposed to an ambient gas regulated in pressure to compress said liquid gallium.

5. The method of producing carbon wire according to claim 1, wherein in the step of exposing, said liquid gallium has a temperature ranging from 450° C. to 750° C.

6. The method of producing carbon wire according to claim 1, comprising, before the step of exposing, the step of providing an amorphous carbon layer as a surface layer of said assembly portion.

7. The method of producing carbon wire according to claim 1, further comprising, after the step of exposing, the step of removing gallium adhering to a surface of said carbon wire.

8. A method of producing a wire assembly, comprising the steps of:
   producing a plurality of carbon wires in the method of producing carbon wire according to any one of claims 1-7; and
   stranding said plurality of carbon wires together to form a wire assembly.

* * * * *